US011835588B2

(12) United States Patent
Kitagawa

(10) Patent No.: US 11,835,588 B2
(45) Date of Patent: Dec. 5, 2023

(54) BATTERY MONITORING SYSTEM AND METHOD AND TRANSPORTATION SYSTEM WITH BATTERY MONITORING SYSTEM

(71) Applicant: DENSO CORPORATION, Kariya (JP)

(72) Inventor: Masaaki Kitagawa, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/932,036

(22) Filed: Jul. 17, 2020

(65) Prior Publication Data

US 2021/0018570 A1    Jan. 21, 2021

(30) Foreign Application Priority Data

Jul. 17, 2019   (JP) ................. 2019-131906

(51) Int. Cl.
| | |
|---|---|
| *G01R 31/389* | (2019.01) |
| *G01R 31/382* | (2019.01) |
| *G01R 31/396* | (2019.01) |
| *H01M 10/42* | (2006.01) |
| *H01M 10/48* | (2006.01) |
| *H02J 7/00* | (2006.01) |

(52) U.S. Cl.
CPC ......... *G01R 31/389* (2019.01); *G01R 31/382* (2019.01); *G01R 31/396* (2019.01); *H01M 10/4235* (2013.01); *H01M 10/48* (2013.01); *H02J 7/0047* (2013.01)

(58) Field of Classification Search
None
See application file for complete search history.

(56) References Cited

U.S. PATENT DOCUMENTS

2006/0170397 A1    8/2006  Srinivasan et al.
2009/0027648 A1*   1/2009  Van Der Wijst ....... G03B 27/58
                                                       702/77
(Continued)

FOREIGN PATENT DOCUMENTS

JP    2005321226 A  * 11/2005
JP    2006-220629 A    8/2006
(Continued)

OTHER PUBLICATIONS

Machine translation of JP 2005-321226 (Year: 2005).*
(Continued)

*Primary Examiner* — Michael J Dalbo
*Assistant Examiner* — Denise R Karavias
(74) *Attorney, Agent, or Firm* — Oliff PLC

(57) ABSTRACT

A waveform designator designates a given waveform of an AC signal by specifying a frequency as a reference. A signal controller causes a storage battery to output a response signal based on its own power. A detector detects a frequency component in the response signal corresponding to the reference frequency of the AC signal based on a product of the reference frequency and the response signal. A calculator calculates a complex impedance of the storage battery based on the frequency component in the response signal. A noise determiner determines presence or absence of a noise signal corresponding to the reference frequency of the AC signal before the signal controller causes the storage battery to output the AC signal. A noise controller either avoids or removes the noise signal.

7 Claims, 12 Drawing Sheets

(56) References Cited

U.S. PATENT DOCUMENTS

| | | | |
|---|---|---|---|
| 2016/0109525 A1* | 4/2016 | Chau | G01R 31/392 |
| | | | 324/426 |
| 2016/0195577 A1 | 7/2016 | Osaka et al. | |
| 2017/0077560 A1* | 3/2017 | Kemp | H01M 10/48 |
| 2017/0179737 A1 | 6/2017 | Emi et al. | |
| 2019/0011503 A1 | 1/2019 | Nagata | |
| 2019/0331738 A1* | 10/2019 | Kodama | G01R 31/396 |
| 2022/0120817 A1* | 4/2022 | Okada | B60L 58/10 |

FOREIGN PATENT DOCUMENTS

| | | | |
|---|---|---|---|
| JP | 2010230659 A | * | 10/2010 |
| JP | 2017058176 A | * | 3/2017 |
| JP | 2017-227519 A | | 12/2017 |
| WO | 2020/218373 A1 | | 10/2020 |

OTHER PUBLICATIONS

Machine translation of JP 2010-230659 (Year: 2010).*
Machine translation of JP 2017-058176 (Year: 2017).*
Van Baak, D.A., Herold George; Response of a lock-in amplifier to noise; Apr. 2014; Am. J. Phys. 82 (8); pp. 785-797 (Year: 2014).*
Guanghao Xu, Ran Duan, Ming Dong, Ming Ren, Jiacheng Xie, Yizhuo Hu; Electrochemical Impedance Spectroscopy Measurement of Lithium Battery Based on Lock-in amplifier; 2019; IEEE Conference on Electrical Insulation and Dielectric Phenomena; pp. 678-681 (Year: 2019).*
Machine Translation JP2010-230659 (labeled) (Year: 2010).*

* cited by examiner

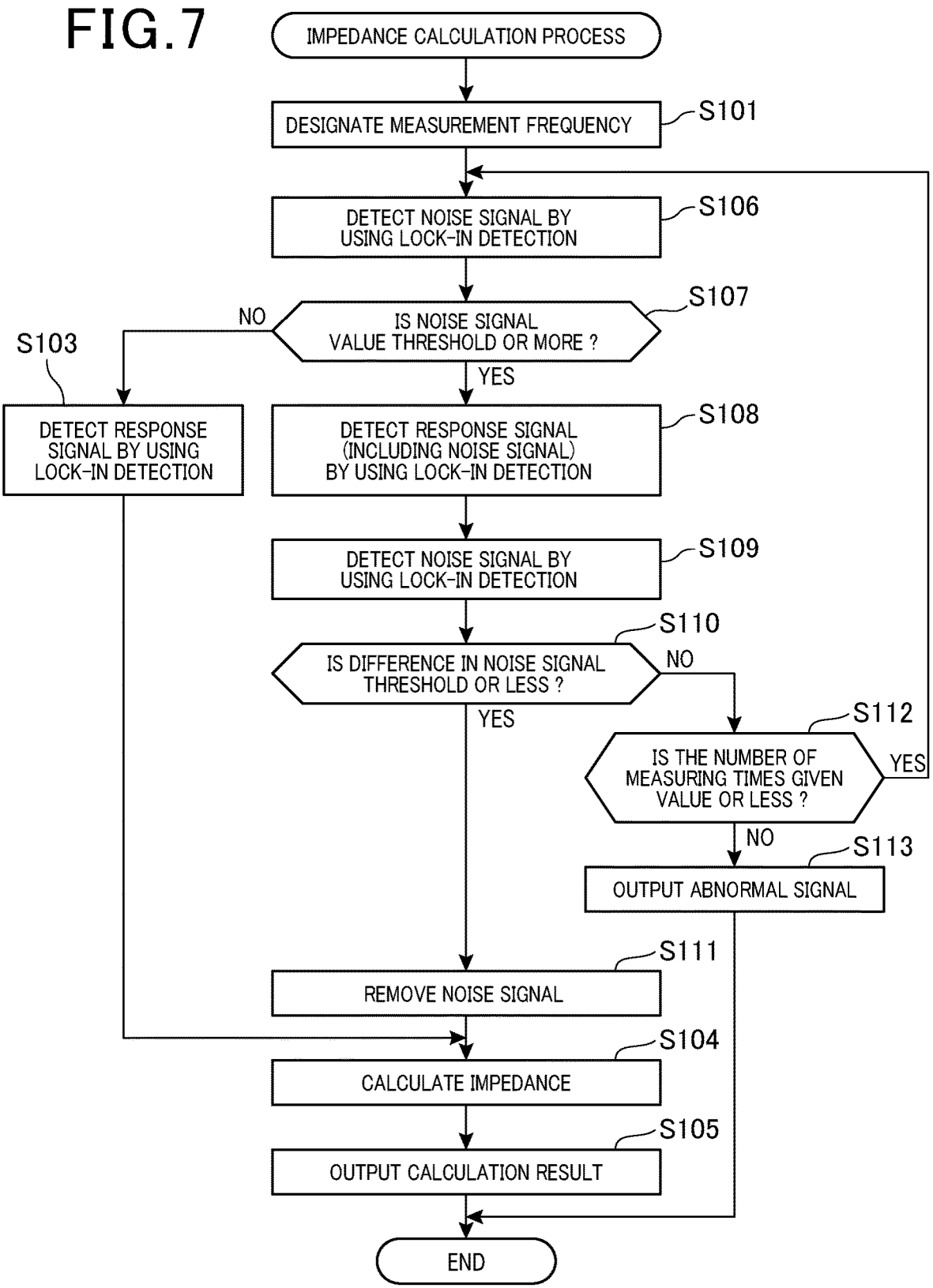

BATTERY MONITORING SYSTEM AND METHOD AND TRANSPORTATION SYSTEM WITH BATTERY MONITORING SYSTEM

CROSS-REFERENCE TO RELATED APPLICATION

This patent application is based on and claims priority to Japanese Patent Application No. 2019-131906, filed on Jul. 17, 2019 in the Japan Patent Office, the entire disclosure of which is hereby incorporated by reference herein.

BACKGROUND

Technical Field

The present disclosure relates to a battery monitoring system and method and a transportation system with the battery monitoring system.

Related Art

Conventionally, to monitor a state of a storage battery, a complex impedance of the storage battery is measured. That is, a power controller applies a rectangular wave signal to the storage battery and calculates a complex impedance characteristic based on a response signal returned therefrom. Subsequently, a deterioration state of the storage battery or the like is determined based on the complex impedance characteristic.

However, when such a complex impedance measurement method is employed to measure a complex impedance of a storage battery mounted on a transportation system, the below described problem arises. That is, since many noisy sources, such as inverters, etc., are included in the transportation system, detection of the complex impedance is generally not accurate.

SUMMARY

Accordingly, the present invention has been made to address the above-described problems and an object thereof is to provide an improved battery monitoring system capable of accurately detecting a complex impedance. According to one aspect of the present disclosure, a novel battery monitoring system for monitoring a state of a storage battery including an electrolyte and multiple electrodes includes a waveform designator (i.e., function of the microcomputer) to designate a given waveform of an AC signal by specifying at least a frequency as a reference. The battery monitoring system also includes a signal controller (i.e., function of the current modulation circuit) to cause the storage battery to output an AC signal as a response signal based on its own power. The battery monitoring system further includes a response signal input unit (i.e., function of the lock-in amplifier) to receive the AC signal as the response signal from the storage battery. The battery monitoring system further includes a frequency component detector (i.e., function of the lock-in amplifier) to detect an AC signal having a frequency component in the response signal corresponding to the reference frequency of the AC signal based on a product of the reference frequency and the response signal received as the input by the response signal input unit (i.e., function of the lock-in amplifier). The battery monitoring system further includes a calculator (i.e., function of the microcomputer) to calculate a complex impedance of the storage battery based on the frequency component of the AC signal detected by the detector in the response signal. The battery monitoring system further includes a noise determiner (i.e., function of the microcomputer) to determine presence or absence of a noise signal having a frequency corresponding to the reference frequency of the AC signal before the signal controller causes the storage battery to output the AC signal. The battery monitoring system further includes a noise controller (i.e., function of the microcomputer) to either avoid or remove the noise signal when the noise determiner recognizes the presence of the noise signal.

Hence, according to one aspect of the present disclosure, the signal controller outputs a given AC signal based on a power supplied by a storage battery as a monitoring target. Hence, an extra power supply is not needed when an AC signal is input to the storage battery, thereby enabling reduction of the number of parts, and accordingly downsizing of a system at low cost.

Further, since a peripheral circuit, such as a protective element, a filter circuit, etc., is commonly connected to the storage battery mounted on the transportation system, a current of the AC signal input to the storage battery partially leaks into the peripheral circuit. Hence, when a complex impedance is calculated based on a response signal generated in response to an input of the AC signal to the storage battery, an error occurs in the response signal, thereby deteriorating detection accuracy of the complex impedance.

However, according to the above-described configuration of the first aspect of the present disclosure, since a given AC signal is output based on a power supplied by the storage battery, a closed circuit can be formed by the signal controller and the storage battery. Hence, leakage of a current from the storage battery can be substantially eliminated, thereby enabling either reduction or suppression of an error.

Further, with the above-described configuration, the detector detects a frequency component in the response signal, corresponding to a frequency of the AC signal. Subsequently, the calculator calculates a complex impedance based on the frequency component in the response signal, detected by the detector. Hence, the complex impedance can be highly accurately calculated while avoiding an impact of a noise signal, such as a white noise, etc. Especially, the complex impedance of the car-mounted storage battery can be precisely calculated even if many noise signals are easily generated therein.

Further, as described above, the frequency component in the response signal corresponding to the frequency of the AC signal is detected. However, when a noise signal having the same frequency, especially having the same phase as the AC signal is present (in the response signal), such a noise signal is also detected, thereby possibly generating an error. In particular, since various devices such as inverter devices, etc., operate at various driving frequencies in the transportation system, the above-described noise signal having the given frequency is highly likely to be generated and output. However, an influence of the noise signal of the same frequency as the AC signal can be suppressed, thereby enabling accurate detection of the complex impedance even when the noise signal is present.

Another aspect of the present disclosure provides a novel transportation system including a battery monitoring system for monitoring a state of a storage battery composed of an electrolyte and multiple electrodes. The battery monitoring system includes a waveform designator (i.e., function of the microcomputer) to designate a given waveform of an AC signal by specifying-a frequency belonging to given measurable frequencies. The battery monitoring system further includes a storage unit (i.e., function of the microcomputer)

to store the measurable given frequencies. The battery monitoring system further includes a signal controller (i.e., function of the current modulation circuit) to cause the storage battery to output an AC signal as a response signal based on its own power as a monitoring target. The battery monitoring system further includes a response signal input unit (i.e., function of the lock-in amplifier) to receive the response signal from the storage battery. The battery monitoring system further includes a frequency component detector (i.e., function of the lock-in amplifier) to detect an AC signal having a frequency component in the response signal corresponding to the reference frequency of the AC signal. The frequency component detector (i.e., function of the lock-in amplifier) detects the AC signal having the frequency component based on a product of the reference frequency and the response signal input to the response signal input unit. The battery monitoring system further includes a calculator (i.e., function of the microcomputer) to calculate a complex impedance of the storage battery based on the frequency component detected by the frequency component detector in the response signal. The given measurable frequencies exclude a frequency of a noise signal output from either a noise generation source mounted on the transportation system or a noise source connected to the transportation system.

Yet another aspect of the present disclosure provides a novel battery monitoring method of monitoring a state of a storage battery. The monitoring method includes the steps of designating a given waveform of an AC signal by specifying a frequency as a reference, determining presence or absence of a noise signal having a frequency corresponding to the reference frequency of the AC signal, and either avoiding or removing the noise signal when the noise signal is determined to be present. The battery monitoring method further includes the steps of causing the storage battery to output an AC signal as a response signal based on its own power, receiving the response signal from the storage battery, and detecting an AC signal having a frequency component in the response signal corresponding to the reference frequency based on a product of the reference frequency and the response signal. The battery monitoring method further includes the step of calculating a complex impedance of the storage battery based on the frequency component of the AC signal as the response signal.

BRIEF DESCRIPTION OF THE DRAWINGS

A more complete appreciation of the present disclosure and many of the attendant advantages of the present disclosure will be more readily obtained as substantially the same becomes better understood by reference to the following detailed description when considered in connection with the accompanying drawings, wherein:

FIG. 7 is a flowchart illustrating an impedance calculation process according to a second embodiment of the present disclosure;

DETAILED DESCRIPTION

Figure 1:
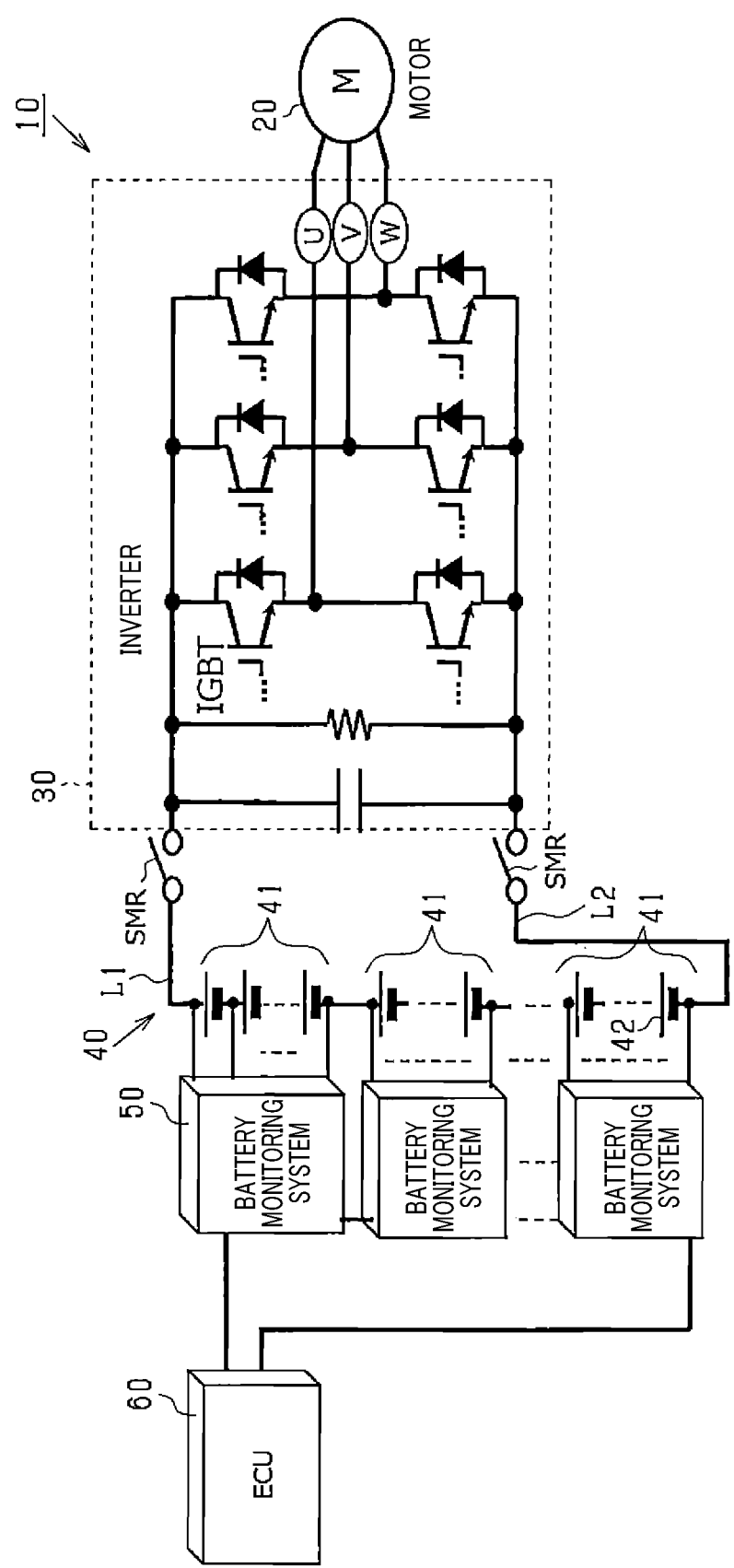
FIG. 1 is a schematic diagram illustrating a power supply system according to a first embodiment of the present disclosure.

Conventionally, to monitor a state of a storage battery, a complex impedance of the storage battery is measured as discussed in Japanese Patent No. 6,226,261 (JP-6,226,261-B2). That is, JP-6,226,261-B2 describes that a power controller applies a rectangular wave signal to the storage battery and calculates a complex impedance characteristic based on a response signal returned therefrom. Subsequently, a deterioration state of the storage battery or the like is determined based on the complex impedance characteristic.

However, when such a complex impedance measurement method is employed to measure a complex impedance of a storage battery mounted on a transportation system (e., transportation system), the below described problem arises. That is, since many noisy sources, such as inverters, etc., are included in the transportation system, detection of the complex impedance is generally not accurate.

Referring now to the drawings, wherein like reference numerals designate identical or corresponding parts throughout the several views thereof, and to FIG. 1, a First embodiment is hereinafter described.

That is, as herein below described with reference to various drawings besides FIG. 1, a battery monitoring system as a first embodiment is employed in a power supply system mounted on a transportation system (e.g., a hybrid transportation system, an electric transportation system).

Specifically, as shown in FIG. 1, the power supply system 10 includes a motor as a rotation electrical machine, an inverter 30 as a power converter for flowing a three-phase current into the motor 20, and an assembled chargeable-dischargeable battery 40. The power supply system 10 also includes a battery monitoring system 50 for monitoring a state of the assembled battery 40 and an ECU (Engine Control Unit) 60 for controlling the motor 20 or the like.

The motor 20 is an on-transportation system main machine enabled to transmit motive power to drive wheels (not shown). In this embodiment, as the motor 20, a permanent magnet synchronous motor of a three-phase type is used.

The inverter 30 is constituted by a full bridge circuit having the same number of upper and lower arms as phase windings, so that an energization current flowing through each of the phase windings is adjusted by turning on-off a switch (e.g., a semiconductor switching element, such as an IGBT (Insulated Gate Bipolar Transistor), etc.) provided in each of the upper and lower arms.

The inverter 30 has an inverter control device (not shown) that performs the energization control by turning on-off each of the switches provided in the inverter 30 based on various detection information generated in the motor 20 and demands for power running drive and power generation. With this, the inverter control device supplies power to the motor 20 via the inverter 30 from the assembled battery 40, thereby causing the motor 20 to perform the power running drive. Further, the inverter control device causes the motor 20 to generate electricity based on a power transmitted from the drive wheels and converts and supplies a generated and converted power to the assembled battery 40 to allow the assembled battery 40 to charge.

Further, the assembled battery 40 is electrically connected to the motor 20 via the inverter 30. For example, the assembled battery 40 has a terminal voltage of about 100V or more. The assembled battery 40 is composed of multiple battery modules 41 connected in series to each other. Each of the battery modules 41 is configured by multiple battery cells 42 connected in series to each other. As the battery cell 42, a lithium ion storage battery and a nickel-metal hydride storage battery can be used, for example. Each of the battery cells 42 is composed of an electrolyte and multiple electrodes.

Further, a positive electrode side power supply path L1 is connected to both a positive electrode side power supply terminal of the assembled battery 40 at one end thereof and a positive electrode side terminal of an electrical load, such as the inverter 30, etc., at the other end thereof. Similarly, a negative electrode side power supply path L2 is connected to both a negative electrode side power supply terminal of the assembled battery 40 at one end thereof and a negative electrode side terminal of the electrical load, such as the inverter 30, etc., at the other end thereof. Further, in each of the positive electrode side power supply path L1 and the negative electrode side power supply path L2, a relay switch SMR (e.g., a system main relay switch) is provided to switch a circuit between an energization state and an energization blocking state.

Further, the battery monitoring system 50 monitors a power storage state (i.e., SOC (state of charge)) and a degradation state (i.e., SOH (state of health)) of each of the battery cells 42. The battery monitoring system 50 is provided per battery cell 42 in the first embodiment. The battery monitoring system 50 is connected to an ECU (Engine Control Unit) 60 to output data of such a state of the battery cell 42 thereto. Details of a configuration of the battery monitoring system 50 will be described later.

The ECU 60 transmits data indicating a request for power running drive and power generation to the inverter control device based on various information. For example, the various information includes operation information of an accelerator and a brake, a transportation system speed and a state of the assembled-battery 40 or the like.

Figure 2:
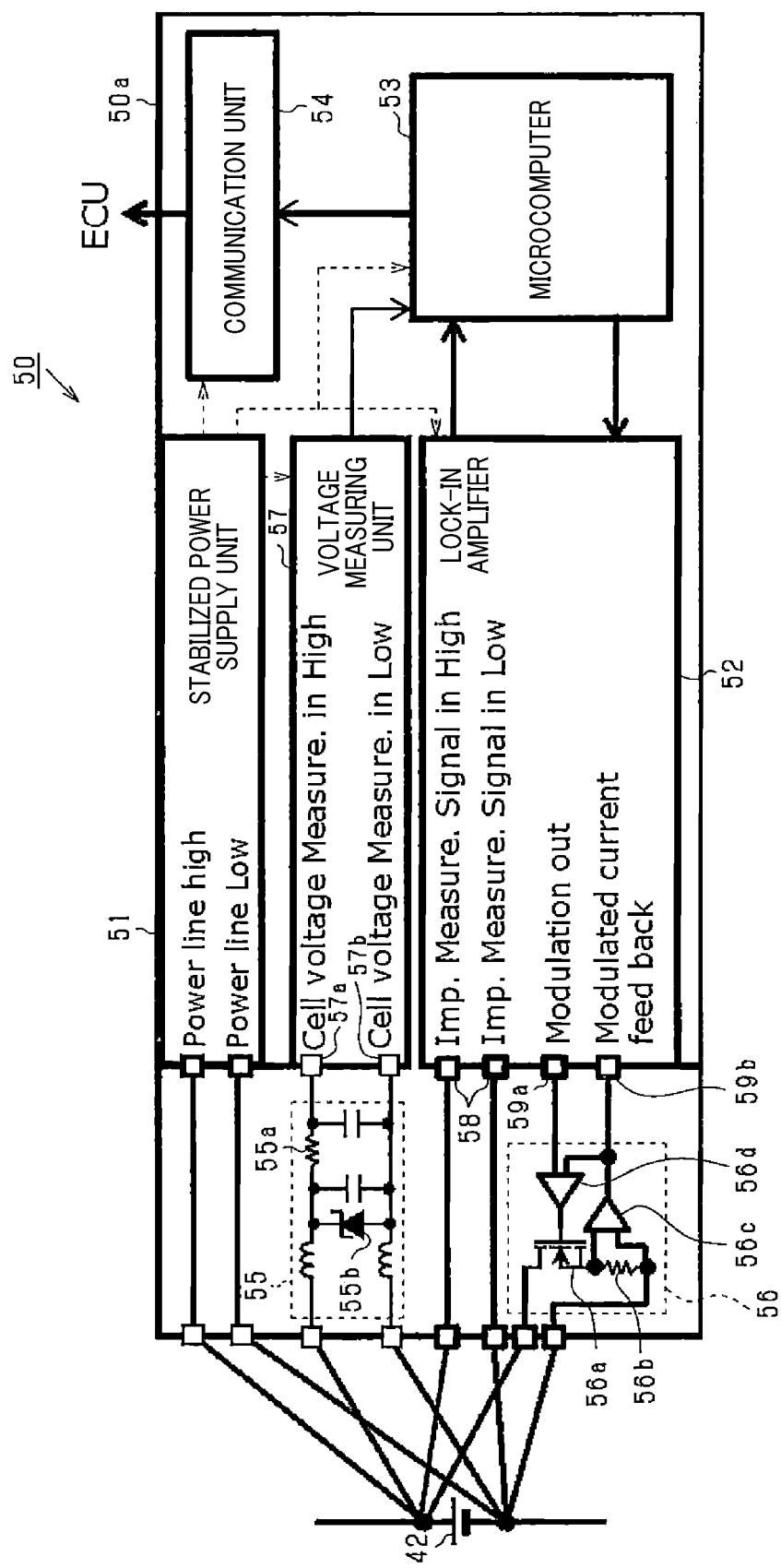
FIG. 2 is a diagram illustrating a configuration of a battery monitoring system according to the first embodiment of the present disclosure.

Now, the battery monitoring system 50 will be herein below described more in detail with reference to FIG. 2. As described earlier, the battery monitoring system 50 is provided for each of the battery cells 42 in the first embodiment.

Specifically, the battery monitoring system 50 includes an ASIC (Application Specific Integrated Circuit) unit 50a, a filter unit 55 and a current modulation circuit 56. The ASIC unit 50a includes a stabilized power supply unit 51, a lock-in amplifier 52 and a microcomputer 53 as a calculator. The ASIC unit 50a also includes a communication unit 54 and a voltage measuring unit 57.

The stabilized power supply unit 51 is connected to a power supply line extended to the battery cell 42 to provide power supplied from the battery cell 42 to the lock-in amplifier 52, the microcomputer 53 and the communication unit 54 as indicated by broken line arrows. The stabilized power supply unit 51 also provides the power to the voltage measuring unit 57 as indicated by a broken line arrow. Hence, the lock-in amplifier 52, the microcomputer 53 and the communication unit 54 are driven based on the power. Also driven based on the power is the voltage measuring unit 57.

Further, the voltage measuring unit 57 is, for example, composed of a differential amplifier and is connected to the battery cell 42 acting as a monitoring target. Specifically, the voltage measuring unit 57 has a set of DC voltage input terminals 57a and 57b capable of receiving and measuring a DC voltage from the battery cell 42. Further, the filter unit 55 is provided between the battery cell 42 and the set of DC voltage input terminals 57a and 57b. More specifically, a RC filter 55a acting as a filter circuit and a Zener diode 55b acting as a protective element or the like are provided between the DC voltage input terminal 57a of the positive electrode side and the DC voltage input terminal 57b of the negative electrode side. That is, each of the RC filter 55a and the Zener diode 55b or the like is connected parallel to the battery cell 42.

Further, the voltage measuring unit 57 is connected to the microcomputer 53 to output the DC voltage thereto upon receiving the input of the DC voltage. Further, the voltage measuring unit 57 is connected to an AD converter (not shown) to convert an analog signal input thereto into a digital signal and output such a conversion result to the microcomputer 53.

Similarly, the lock-in amplifier 52 is also connected to the battery cell 42 as a monitoring target. The lock-in amplifier 52 has a set of response signal input terminals 58 for receiving a response signal (i.e., voltage variation) reflecting an internal complex impedance (information) of the battery cell 42 between the terminals of the battery cell 42. Hence, the lock-in amplifier 52 functions as a response signal receiver according to one embodiment of the present disclosure.

Further, the lock-in amplifier 52 is also connected to the current modulation circuit 56 acting as a signal controller. Specifically, the lock-in amplifier 52 has an instruction signal output terminal 59a for outputting an instruction signal to the current modulation circuit 56. The instruction signal instructs the battery cell 42 to output a sine wave signal (i.e., AC signal). Further, the lock-in amplifier 52 also has a feedback signal input terminal 59b. That is, the feedback signal input terminal 59b receives a current signal actually output from (i.e., flowing through) the battery cell 42 as a feedback signal via the current modulation circuit 56.

Further, the lock-in amplifier 52 is also connected to the microcomputer 53. Specifically, the lock-in amplifier 52 outputs the response signal received via the response signal input terminal 58 and the feedback signal received via the feedback signal input terminal 59b to the microcomputer 53.

Further, the lock-in amplifier 52 has an AD converter therein to convert an analog signal as an input into a digital signal and output such a conversion result to the microcomputer 53.

Further, the lock-in amplifier 52 is enabled to receive signals from the microcomputer 53. The lock-in amplifier 52 is also enabled to output an instruction signal to the current modulation circuit 56 via the instruction signal output terminal 59a based on an instruction transmitted from the microcomputer 53. Further, the lock-in amplifier 52 also has a DA converter therein to convert a digital signal into an analog signal and outputs the analog signal as an instruction signal to the current modulation circuit 56. Further, a DC bias is applied to a sine wave signal output to the current modulation circuit 56 as an instruction so that the sine wave signal will not become a negative current (i.e., backflow relative to the battery cell 42). Further, the current modulation circuit 56 causes the battery cell 42 to output a given AC signal (i.e., sine wave signal) based on a power supplied by the battery cell 42 as a monitoring target. Specifically, the current modulation circuit 56 has a semiconductor switching element 56a (e.g., MOSFET (metal-oxide-semiconductor field-effect transistor)) as a switch unit and a resistor 56b connected in series to the semiconductor switching element 56a. Further, a drain terminal of the semiconductor switching element 56a is connected to the positive electrode terminal of the battery cell 42. A source terminal of the semiconductor switching element 56a is connected in series to one end of the resistor 56b. The other end of the resistor 56b is connected to the negative electrode terminal of the battery cell 42. Further, the semiconductor switching element 56a is enabled to adjust an energization amount (i.e., amount of current flowing between a drain terminal and a source terminal). Further, to adjust a voltage applied to the semiconductor switching element 56a in accordance with an operating region thereof, a resistor is sometimes inserted in series in the current modulation circuit 56.

Here, the positive electrode terminal and the negative electrode terminal of the battery cell 42 is connected to respective electrodes (i.e., positive electrode and negative electrode) thereof. Further, the set of response signal input terminals 58 is desirably connected to locations closest to the positive electrode and the negative electrode of the battery cell 42. That is, the positive electrode terminal and the negative electrode terminal are desirably closest to the respective electrodes of the battery cell 42. Similarly, connection portions of the set of DC voltage input terminals 57a and 57b are desirably located closest to the electrodes. Otherwise, these connection portions are located next to the respective connection portions of the response signal input terminals 58 when the response signal input terminals are located closest. With this, an influence of voltage drop caused by either a main current or an equalization current can be substantially minimized.

Further, a current detection amplifier 56c is provided as a current detector in the current modulation circuit 56 and is connected to both ends of the resistor 56b. The current detection amplifier 56c detects a signal (i.e., current signal) input via the resistor 56b and outputs such a detection signal to the feedback signal input terminal 59b of the lock-in amplifier 52 as a feedback signal.

Further, a feedback circuit 56d is also provided in the current modulation circuit 56. The feedback circuit 56d receives an instruction signal from the instruction signal output terminal 59a of the lock-in amplifier 52. The feedback circuit 56d also receives the feedback signal from the current detection amplifier 56c. Subsequently, the feedback circuit 56d compares the instruction signal with the feedback signal and outputs such a comparison result to a gate terminal of the semiconductor switching element 56a.

Further, the semiconductor switching element 56a adjusts a voltage applied between the gate and the source and accordingly an amount of current flowing between the drain and source based on a signal transmitted from the feedback circuit 56d to cause the battery cell 42 to output a sine wave signal (i.e., a given AC signal) instructed by the instruction signal. Hence, if an error is present between a waveform instructed by the instruction signal and a waveform of current actually flowing through the resistor 56b, the semiconductor switching element 56a adjusts an amount of current to correct the error based on a signal transmitted from the feedback circuit 56d. With this, the sine wave signal of current flowing through the resistor 56b becomes stable.

Now, a method of calculating a complex impedance of a battery cell 42 will be described sometimes with reference to applicable drawings. In general, to calculate a complex impedance of a storage battery, an AC signal (i.e., current signal) is input (i.e., signal current is flowed) into the storage battery to obtain a voltage variation generated in the storage battery. Subsequently, a complex impedance is calculated based on the AC signal and the voltage variation. However, with the above-described battery cell 42 mounted on the transportation system, since a peripheral circuit, such as a protective element (e.g., a Zener diode 55b), a filter circuit (e.g., a RC filter 55a), etc., is usually connected to the battery cell 42, a current of an AC signal to be input to the battery cell 42 partially leaks into the peripheral circuit. Hence, the voltage variation cannot be accurately received as an input. Further, the battery cell 42 of the transportation system can be affected by many noise signals generated therein. For example, a white noise (i.e., signal) and a resonance having a given frequency produced by a drive frequency of the inverter 30 are exemplified.

Hence, according to this embodiment, to address the above-described problems, a complex impedance is calculated in a manner as will be herein below described in detail.

Figure 3:
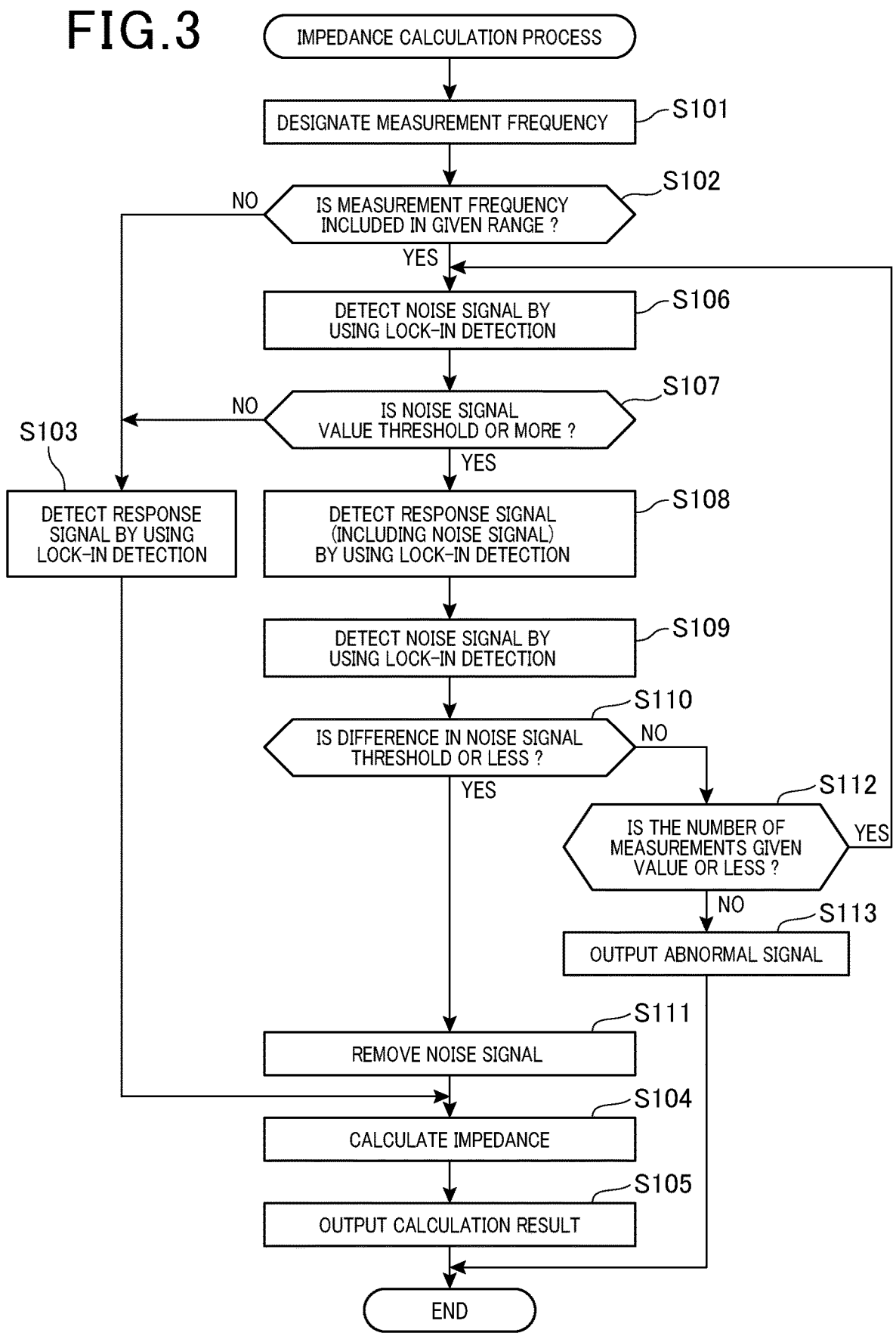
FIG. 3 is a flowchart illustrating an impedance calculation process according to the first embodiment of the present disclosure.

Specifically, a microcomputer 53 of the battery monitoring system 50 periodically executes an impedance calculation process as shown in FIG. 3. In the impedance calculation process, the microcomputer 53 initially designates a measurement frequency used in measuring the complex impedance (of a battery cell 52 by specifying a give waveform of an AC signal to be output by the battery cell 52) in step S101. The measurement frequency is designated in accordance with a type of the battery cell 42. For example, when the battery cell 42 employs a lithium ion battery, a frequency is chosen from a practically measurable range ranging from about a few MHz to about a few kHz to effectively measure a complex impedance thereof. Hence, with this process, the microcomputer 53 corresponds to a waveform designator according to one embodiment of the present disclosure.

Subsequently, the microcomputer 53 determines whether the measurement frequency is within a given range in step S102. Here, the given frequency range represents a range (i.e., noise range) in that a noise signal having a constant frequency is highly likely to be generated. For example, a noise signal caused by the inverter 30 as a noise source has either substantially the same frequency to a drive frequency of the inverter 30 or a higher harmonic wave component of the drive frequency. The noise signal can also include resonance frequency caused by L (inductance) and C (capacitance) components respectively including a parasitic inductance and a parasitic capacity of the inverter 30. The noise signal can further include a higher harmonic wave of the resonance frequency. Hence, a frequency range in which a noise signal having a constant frequency is highly likely generated can be predictable. In view of this, a given frequency range is determined based on either a driving frequency of a noise source, such as an inverter 30, etc., or an experimental result. That is, the given frequency range in which the noise signal having a constant frequency is highly likely generated is determined based on the frequency of the noise signal output from the noise source and is stored in the microcomputer 53 acting as a storage unit.

Further, if a determination performed in step S102 is negative (No, in step S102), the microcomputer 53 notifies the lock-in amplifier 52 of a measurement frequency and instructs the lock-in amplifier 52 to detect a frequency component of the measurement frequency in a response signal in step S103.

Figure 4:
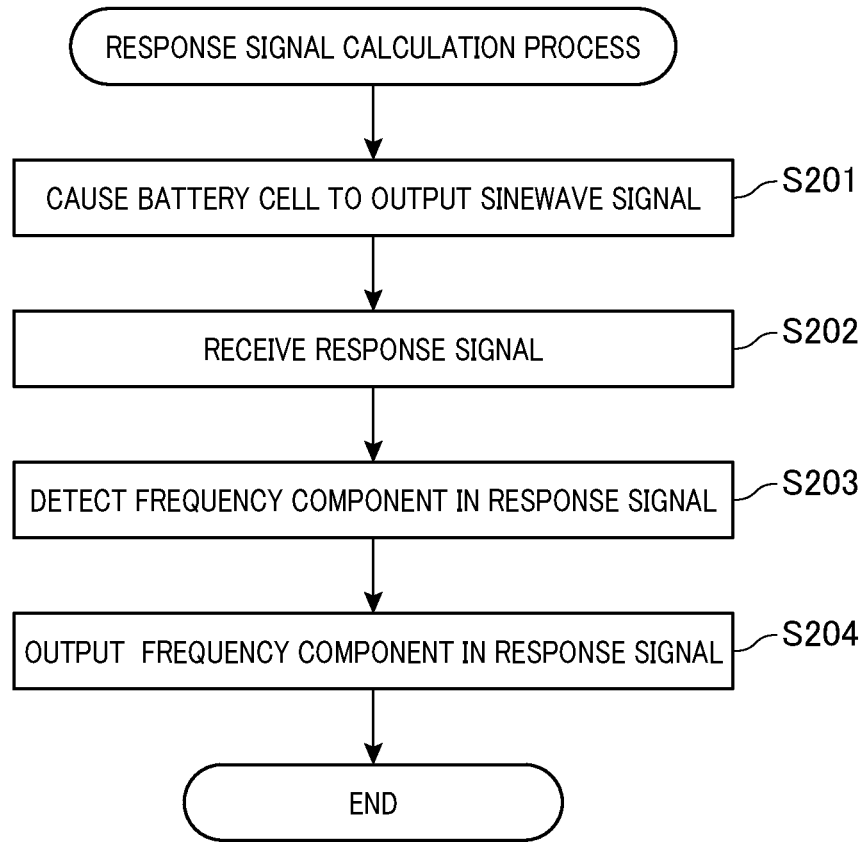
FIG. 4 is a flowchart illustrating a response signal detection process according to the first embodiment of the present disclosure.

More specifically, in step S103, the microcomputer 53 determines a frequency of a sine wave signal (i.e., given AC signal) based on the measurement frequency. The microcomputer 53 then outputs an instruction signal for instructing an output of the sine wave signal to the lock-in amplifier 52 to cause the lock-in amplifier 52 to perform so-called lock-in detection of detecting a response signal. Now, a response signal detection process performed by the lock-in amplifier 52 will be herein below described in detail with reference to FIG. 4.

That is, upon receiving the instruction signal from the microcomputer 53, the lock-in amplifier 52 causes the battery cell 42 to output a sine wave signal based the instruction signal to the battery cell 42 based on a power supplied from the battery cell 42 in step S201. Specifically, the lock-in amplifier 52 converts the sine wave signal indicated by the input instruction signal into an analog signal by using the DA converter and outputs such a conversion result to the current modulation circuit 56. With this, based on the power supplied by the battery cell 42, the current modulation circuit 56 causes the battery cell 42 to output the sine wave signal based on the instruction signal. More particularly, the semiconductor switching element 56a adjusts an amount of current based on a signal input thereto via the feedback circuit 56d to cause the battery cell 42 to output the sine wave signal as instructed by the instruction signal. With this, a disturbance is given to the battery cell 42 and the sine wave signal is output from the battery cell 42.

Hence, when the battery cell 42 is forced to output the sine wave signal therefrom, a voltage variation reflecting an internal complex impedance of the battery cell 42 occurs between the terminals of the battery cell 42. The lock-in amplifier 52 accordingly receives the voltage variation as a response signal via the response signal input terminal 58 in step S202. At that time, the AD converter converts the voltage variation into a digital signal.

Subsequently, the lock-in amplifier 52 multiplies a reference signal determined in accordance with a sine wave signal to be output (from the battery cell 42) by the response signal received as an input thereto. The reference signal may be the above-described measurement frequency, for example. The lock-in amplifier 52 then performs lock-in detection of detecting (i.e., extracting) a frequency component (i.e., DC component as a detection target) in a frequency (i.e., measurement frequency) of the sine wave signal as the response signal based on the value obtained by the above-described multiplication in step S203. Specifically, the frequency component (i.e., DC component as a target) is detected by using a low-pass filter. Here, the sine wave signal instructed by the instruction signal to be output is used as the reference signal. However, the reference signal can be a signal actually flowing through the resistor 56b (i.e., feedback signal).

Subsequently, the lock-in amplifier 52 outputs the frequency component extracted from the response signal to the microcomputer 53 in step S204. With this, the lock-in detection of detecting the response signal is terminated.

Herein below, the impedance calculation process is described again with ref back to FIG. 3.

When the microcomputer 53 receives the frequency component in the response signal transmitted from the lock-in amplifier 52 after the process of step S103 is completed, the process proceeds to step S104. In step S104, the microcomputer 53 calculates all or any of a real part, an imaginary part, an absolute value and a phase of the complex impedance based on the frequency component in the response signal input thereto and a current signal output from the battery cell 42 in step S104. That is, the current signal may be obtained based on either the feedback signal or the sine wave signal instructed to be output by the instruction signal. Otherwise, the current signal may be obtained by performing lock-in detection of detecting the measurement frequency component in the feedback signal.

Subsequently, the microcomputer 53 outputs the complex impedance as calculated to the ECU 60 via the communication unit 54 in step S105. Hence, the impedance calculation process is terminated.

Now, a process performed when a determination performed in step S102 is positive will be herein below described. That is, a process performed when the measurement frequency falls within a given frequency range and accordingly, a noise signal having a constant frequency is highly likely to occur will be described. Specifically, when a determination performed in step S102 is positive, the microcomputer 53 instructs the lock-in amplifier 52 to detect a noise signal (i.e., background noise) in step S106.

Figure 5:
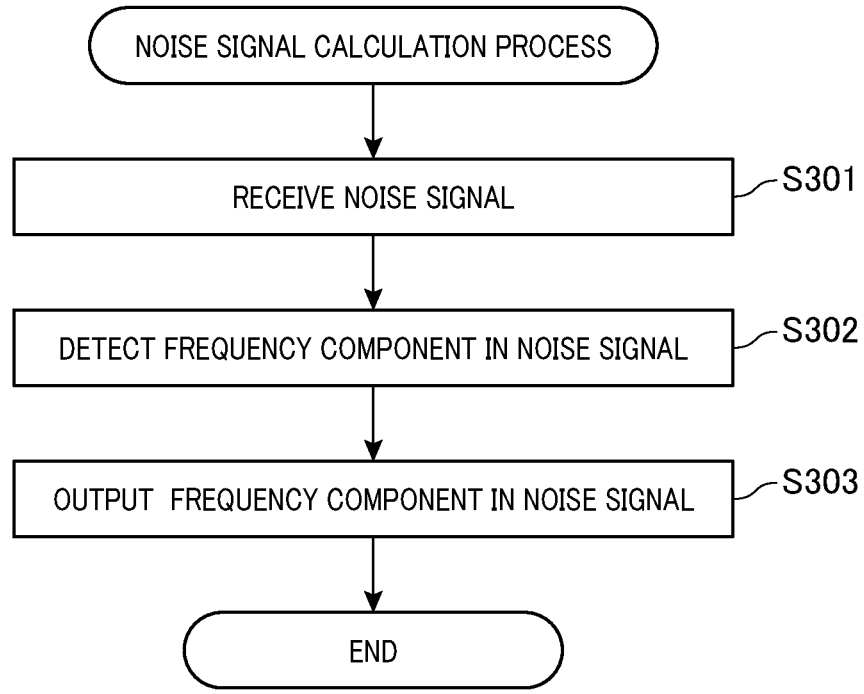
FIG. 5 is a flowchart illustrating a noise signal detection process according to the first embodiment of the present disclosure.

Hence, in step S106, the microcomputer 53 causes the lock-in amplifier 52 to perform lock-in detection of detecting a noise signal (i.e., background noise) detectable when disturbance is not applied to the battery cell 42 as will be described in detail with reference to FIG. 5. That is, the noise signal detection process is performed by the lock-in amplifier 52 as described in FIG. 5.

Specifically, when it is instructed to detect the noise signal (e.g., background noise), the lock-in amplifier 52 receives a voltage variation caused in the battery cell 42 as a noise signal as is via the response signal input terminal 58 in step S301. That is, the lock-in amplifier 52 receives the input of a voltage variation caused in the battery cell 42 during a normal state in which the disturbance is not applied to the battery cell 42. At that time, the lock-in amplifier 52 receives the input of a voltage variation as a digital signal converted by the AD converter from the analog signal.

Subsequently, the lock-in amplifier 52 multiplies the reference signal corresponding to the sine wave signal to be output from the storage battery (42) by the noise signal as input. Subsequently, the lock-in amplifier 52 performs lock-in detection for extracting a sine wave signal having a frequency component (i.e., DC component) corresponding to the measurement frequency based on the value obtained by such multiplication in step S302.

Here, in step S302, the lock-in detection can be repeated multiple times as needed and an average value thereby obtained may be calculated. Otherwise, the noise signal can be added multiple times and leveled when the AD conversion is performed. With this, only noise components with an aligned phase can be detected as a background noise while neglecting noise components with a misalignment phase as the background noise.

Subsequently, the lock-in amplifier 52 outputs the frequency component of the noise signal extracted in this way to the microcomputer 53 in step S303. Hence, the lock-in detection detecting the noise signal is terminated.

Herein below, the impedance calculation process is further described in detail with reference to FIG. 3 again.

When the process of step S106 is completed and it receives the frequency component of the noise signal from the lock-in amplifier 52, the microcomputer 53 performs a process of step S107. That is, in step S107, the microcomputer 53 determines whether the frequency component of the noise signal as input is more than a given reference value. With this process, the microcomputer 53 determines if a noise signal is either present or absent. Hence, the microcomputer 53 of this embodiment corresponds to a noise determiner according to one embodiment of the present disclosure.

Specifically, if the determination performed in step S107 is negative, i.e., the noise signal is not greater than the given reference value, the process proceeds to step S103.

By contrast, if the determination performed in step S107 is positive, the microcomputer 53 notifies the lock-in amplifier 52 of a measurement frequency to instruct the lock-in amplifier 52 to detect a frequency component of the measurement frequency in a response signal including the noise signal in step S108. With this, similar to the process described above with reference to FIG. 4, the microcomputer 53 causes the lock-in amplifier 52 to input (i.e., provide) a voltage variation caused in the battery cell 42 when the sine wave signal flows through the battery cell 42 to the microcomputer 53 as the response signal (including the noise signal). At that time, the microcomputer 53 causes the lock-in amplifier 52 to perform a so-called lock-in detection to detect a frequency component of the frequency of the sine wave signal (i.e., measurement frequency) in the response signal including the noise signal. Here, the frequency component in the response signal input in step S108 necessarily contains an error caused by the noise signal.

Subsequently, when the process of step S108 is completed and the microcomputer 53 receives the frequency component in the response signal from the lock-in amplifier 52, the process proceeds to step S109. In step S109, similar to the process performed in step S106, the microcomputer 53 instructs the lock-in amplifier 52 again to detect a noise signal in step S109. Then, lock-in detection of detecting the noise signal is performed. However, since the lock-in detection of detecting the noise signal is substantially the same to that performed in step S106, a detailed description thereof will be herein below omitted.

Further, in the processes performed from step S106 to step S109, a phase of the reference signal needs to be adjusted to substantially the same value. That is, if the phase of the reference signal varies, the lock-in detection cannot be adequately performed. In view of this, as a countermeasure, a reference signal once output in step S106 is continuously output in other steps than step S106 to consistently maintain the same phase as the noise component.

Further, after the process of step S109 is completed and the frequency component of the noise signal is input from the lock-in amplifier 52, the process proceeds to step S110 and the microcomputer 53 performs a process thereof. In step S110, the microcomputer 53 compares the frequency component in the noise signal input thereto during the process of step S106 with the frequency component in the noise signal input during the process of step S109. Subsequently, the microcomputer 53 determines whether a difference in noise signal (i.e., difference in amplitude) is less than or equal to a threshold value in step S110. That is, the microcomputer 53 determines whether the noise signal changes before and after obtaining the frequency component in the response signal.

Further, if determination performed in step S110 is positive (i.e., there is no change), the microcomputer 53 removes the noise signal from the frequency component in the response signal input thereto during the process of step S108 in step S111. More specifically, the microcomputer 53 compares the frequency component in the response signal input thereto during the process of step S108 with the frequency component in the noise signal input thereto during the process of step S106 (or step S109) and removes the noise signal. In short, the microcomputer 53 removes the noise signal by subtracting the frequency component of the noise signal from the frequency component in the response signal. Hence, the microcomputer 53 corresponds to the noise controller according to one embodiment of the present disclosure.

Subsequently, the process proceeds to step S104. Then, the microcomputer 53 calculates all or any of a real part, an imaginary part, an absolute value and a phase of a complex impedance based on the frequency component in the response signal calculated in step S111 and the current signal output from the battery cell 42 in step S104.

By contrast, if determination performed in step S110 is negative (i.e., there is a change), the microcomputer 53 determines whether the number of measurements measuring the response signal is less than or equal to a given number of times in step S112. If the determination is positive, the process proceeds again to step S106. At that time, the number of measurements measuring the response signal is counted up by one. The number of measurements is deleted at either a start or an end of the impedance calculation process.

By contrast, if the determination performed in step S112 is negative, the microcomputer 53 outputs an abnormal signal to the ECU 60 via the communication unit 54 to inform the ECU 60 that the microcomputer 53 cannot accurately input the response signal thereto in step S113. Because, a background noise wildly changes and does not fall into a practically measurable range as a response signal within a given time period. Then, the impedance calculation process is terminated.

The impedance calculation process is repeatedly executed until complex impedances are calculated for multiple frequencies included in the practically measurable range, respectively. Further, based on such a calculation result, the ECU 60 generates, for example, a complex impedance plane plot (i.e., call-call plot) to recognize characteristics of the electrodes and the electrolyte or the like. For example, the ECU 60 may recognize the power storage state (i.e., SOC) and the degradation state (i.e., SOH).

Further, the call-call plot does not always need to be entirely generated and may be only partially generated. For example, a change in SOC, SOH and battery temperature or the like caused during running of the transportation system may be known as time elapses based on a change in complex impedance measured during running of the transportation system for a specified frequency at a given interval. Alternatively, when the complex impedance is measured for a specified frequency at an interval, such as every other day, every other week, every other year, etc., a change in SOH or the like may be also known as time elapses based on a change in complex impedance obtained for the specified frequency.

Hence, the battery monitoring system 50 of the first embodiment described heretofore can obtain the below described advantages.

First, as described earlier, the lock-in amplifier 52 detects the frequency component in the response signal corresponding to the measurement frequency based on the value obtained by multiplying the response signal by the reference signal. The microcomputer 53 then calculates the complex impedance based on the frequency component in the response signal and the sine wave signal (i.e., current signal). Hence, by performing the so-called lock-in detection in this way, only the frequency component same to the measurement frequency of the sine wave signal can be extracted from the response signal. Hence, the complex impedance can be highly accurately calculated while avoiding disturbance of the white noise and the pink noise. Especially, even though a large number of noises are generated when it is employed in a transportation system, the complex impedance can be precisely calculated. Further, since it is hardly disturbed by the noises, a current (i.e., sine wave signal) output from the battery cell 42 can be minimized. Hence, power consumption and a rise in temperature of each of the battery cell 42 and the semiconductor switching element 56a can be suppressed.

Further, when a frequency component in a response signal corresponding to a measurement frequency is detected in the above-described manner and a noise signal of the same frequency as the measurement frequency is present (i.e., included therein), the noise signal will also be detected, thereby being likely to generate an error. In particular, in a transportation system, various devices, such as an inverter, etc., operate at a given driving frequency, thereby being high likely to output noise signals at the given frequency. For example, even in the first embodiment, the inverter 30 sometimes operates at the given driving frequency.

In view of this, before a sine wave signal is output from the battery cell 42, presence or absence of a noise signal corresponding to a frequency (i.e., measurement frequency) of the sine wave signal instructed by the microcomputer 53 to be output is determined. Then, if it is present, the noise signal is removed.

More specifically, the microcomputer 53 subtracts the frequency component of the noise signal from the frequency component in the response signal and calculates a complex impedance based on the frequency component in the response signal obtained after such a subtraction and a current signal output from the battery cell 42. With this, even when the noise signal of the same frequency to the measurement frequency is present, an influence of the noise signal can be either suppressed or reduced, thereby enabling highly accurate detection of the complex impedance.

Further, before the battery cell 42 outputs the sine wave signal, the lock-in amplifier 52 receives the noise signal flowing through the battery cell 42. The lock-in amplifier 52 then detects a frequency component in the noise signal corresponding to the sine wave signal based on a value obtained by multiplying the noise signal by a reference signal determined in accordance with the sine wave signal instructed by the instruction signal to be output.

With this, as in a case of calculating the complex impedance, since the frequency component in the noise signal corresponding to the measurement frequency is subjected to the lock-in detection, the noise signal can be highly accurately removed. In addition, since the lock-in amplifier 52 is utilized to identify the noise signal, the system can be simplified.

Further, as described earlier, in the transportation system, since the inverter 30 or the like operates at a given driving frequency, a noise signal is highly provably generated based on the given driving frequency in a specific frequency band. In view of this, when the measurement frequency designated in step S101 is within a given frequency range, the microcomputer 53 determines that the noise signal is likely to be present. With this, presence or absence of the noise signal can be readily determined in accordance with the measurement frequency.

Furthermore, when it is determined that the noise signal is likely to be present, the microcomputer 53 determines if the noise signal is actually either present or absent based on a determination whether the frequency component in the noise signal detected by the lock-in amplifier 52 by using the lock-in detection is more than a reference value. With this, present or absent of the noise signal can be highly accurately determined.

Further, the current modulation circuit 56 causes the battery cell 42 as the monitoring target to output the sine wave signal (i.e., given AC signal) based on the power supplied by the battery cell 42. Hence, an external power supply to input the sine wave signal to the battery cell 42 is not required, thereby enabling reduction of the number of parts and downsizing a system at low cost.

Further, since a peripheral circuit, such as a protective element, a filter circuit, etc., is generally connected to a storage battery mounted in a transportation system, it partially leaks into the peripheral circuit when an AC signal is input to the storage battery. For example, also in the first embodiment, the RC filter 55a and the Zener diode 55b are connected to the battery cell 42, it partially leaks into these circuits when an AC signal is input to the battery cell 42. Hence, when the AC signal is input to the battery cell 42 and the complex impedance is calculated based on the response signal therefrom, an error occurs in the response signal due to the influence of the current leakage, thereby deteriorating detection accuracy in detecting the complex impedance.

However, in the battery monitoring system 50 of the first embodiment, since the sine wave signal is controlled to be output based on the power supplied from the battery cell 42, a closed circuit can be formed by including the current modulation circuit 56 and the battery cell 42. Hence, the current does not leak from the battery cell 42, thereby enabling suppression of the error in the response signal.

Further, an error sometimes occurs between a signal actually flowing through the resistor 56b included in the current modulation circuit 56 and a sine wave signal to be output from the battery cell 42, thereby causing an error in the response signal. In view of this, according to the first embodiment of the pin, the feedback circuit 56d is provided in the current modulation circuit 56 to perform feedback based on a comparison between the feedback signal (i.e., detection signal) and an instruction signal when instructing the semiconductor switching element 56a. With this, the sine wave signal can be constantly and accurately output from the battery cell 42 as instructed.

Further, when the current modulation circuit 56 is instructed by the instruction signal to obtain the waveform of the sine wave signal, the instruction signal is converted from the digital signal to the analog signal, thereby possibly causing an error during the conversion. In such a situation, the error can be suppressed if a filter circuit or the like is provided between the lock-in amplifier 52 and the current modulation circuit 56 to smooth the waveform of the instruction signal. However, it either upsizes a system or is costly.

In addition, when a complex impedance is calculated, since the battery cell 42 of the transportation system has generally a large capacity, a measurement range of a measurement frequency tends to be wider. Accordingly, the filter circuit is highly likely to be upsized, correspondingly. Hence, in the first embodiment, the feedback control is performed to suppress the error in the waveform of the instruction signal during the signal conversion. With this, the filter circuit does not need to be disposed between the lock-in amplifier 52 and the current modulation circuit 56. As an exception, the antialiasing filter is used in AD conversion upon need.

Further, the current modulation circuit 56 is configured to detect a signal (i.e., current) flowing through the resistor 56b and output such a detection signal to the lock-in amplifier 52 as a feedback signal. The lock-in amplifier 52 is configured to be able to use the feedback signal as a current signal. With this, if the feedback signal (i.e., signal actually flowing through the resistor 56b) is utilized, calculation accuracy of calculating the complex impedance can be improved even when an error occurs between a signal that actually flows through the resistor 56b and a sine wave signal to be output (i.e., signal instructed by the microcomputer 53 to be output).

In this way, when the error is corrected by using the feedback signal, since the filter circuit can be omitted from between the lock-in amplifier 52 and the current modulation circuit 56, the battery monitoring system 50 can be downsized. Further, although the anti-aliasing filter for AD conversion is used as needed as described earlier, since a relatively high cutoff frequency can be used, and accordingly an element with a small constant can be employed, thereby also enabling downsizing of the system.

Figure 6A:
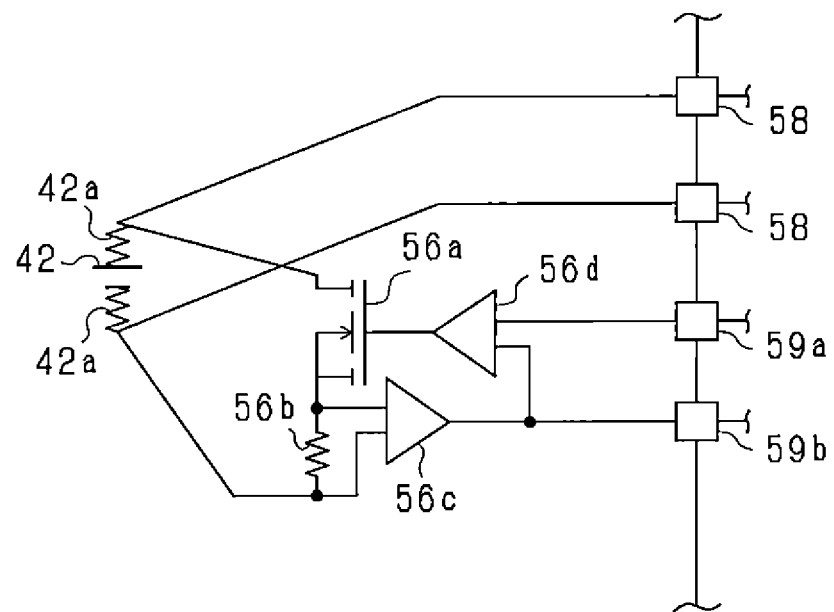
FIGS. 6A and 6B are diagrams illustrating connection positions according to the first embodiment of the present disclosure.
Figure 6B:
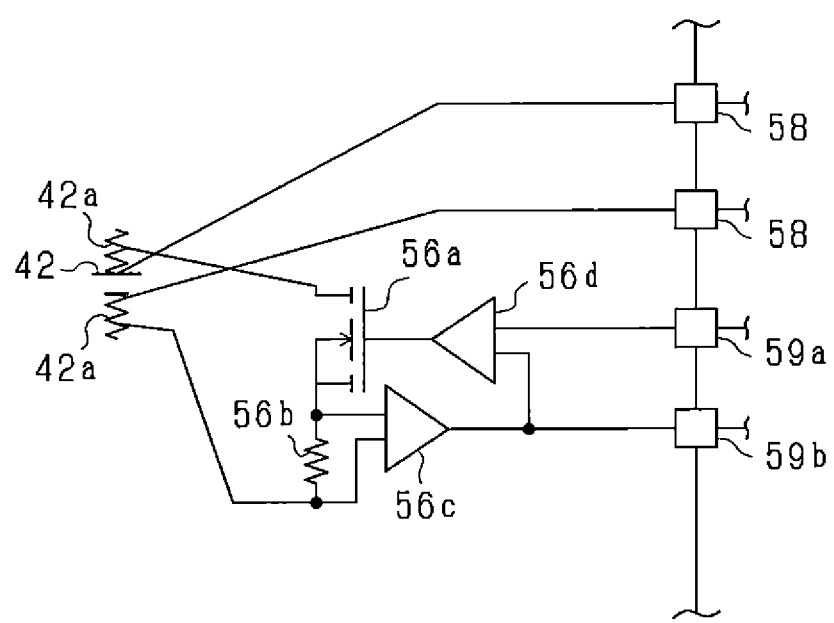

Further, in the first embodiment, since the response signal input terminal 58 is connected to a terminal portion closest to the electrode of the battery cell 42, and accordingly, an influence of an impedance component generated by the terminal portion of the battery cell 42 is either suppressed or reduced, calculation accuracy of calculating the complex impedance can be further improved. To be described in more detail, a pair of terminal 42a of the battery cell 42 has impedance components as shown in FIGS. 6A and 6B. Hence, the set of response signal input terminals 58 is desirably connected to respective portions closer to the electrodes as shown in FIG. 6B than respective portions thereof as shown in FIG. 6A. With this, calculation accuracy of calculating the complex impedance can be further improved. Furthermore, as shown in FIG. 6B, the connection portions of the set of response signal input terminals 58 are preferably closer to the electrodes than connection portions of the current modulation circuit 56.

Now, a battery monitoring system 50 according to a second embodiment will be herein below described with reference to FIG. 7. As shown in the second embodiment, an impedance calculation process is different from that performed in the first embodiment. Specifically, as shown in FIG. 7, in the impedance calculation process of the second embodiment, a process of step S102 is omitted. That is, regardless of a value of a measurement frequency, a frequency component in a noise signal corresponding to the measurement frequency is subjected to lock-in detection and presence or absence of the noise signal is determined based on a size of the frequency component. Herein below, the same reference numerals are added to the same or equivalent portions in each of the below described embodiments and description is herein below incorporated by reference.

Figure 8:
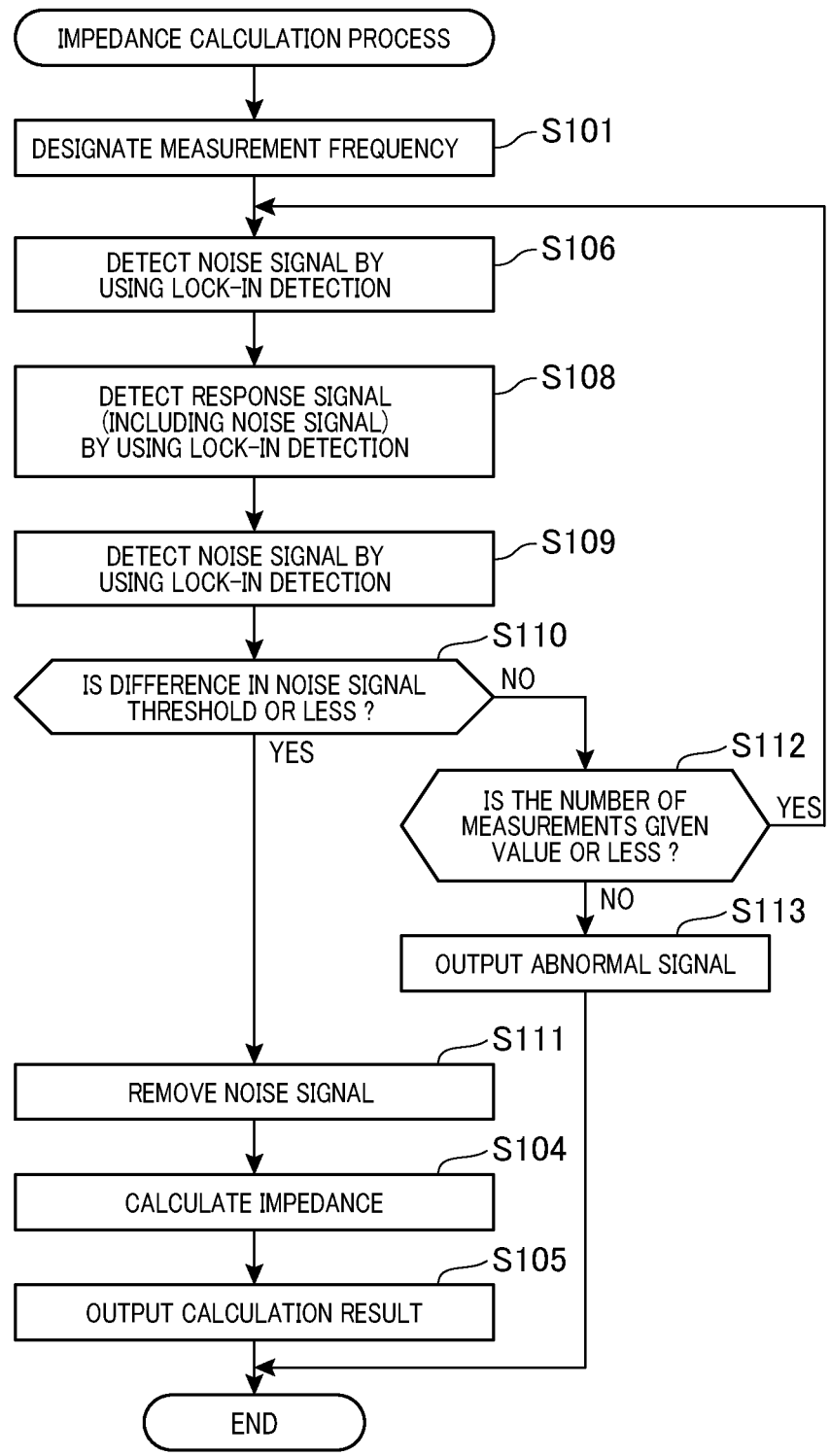
FIG. 8 is a flowchart illustrating an impedance calculation process according to a third embodiment of the present disclosure.

Now, a battery monitoring system 50 according to a third embodiment will be herein below described with reference to FIG. 8. As shown, in the third embodiment, an impedance calculation process is different from that performed the first embodiment again. Specifically, as shown in FIG. 8, in the impedance calculation process of the third embodiment, presence or absence of a noise signal is not determined. That is, the processes of steps S102, S103 and S107 are omitted.

Hence, regardless of either presence or absence of a noise signal, the microcomputer 53 performs lock-in detection every time to detect a frequency component in the noise signal, corresponding to the measurement frequency. The microcomputer 53 then removes the frequency component of the noise signal as detected from a frequency component in a response signal.

Now, a battery monitoring system 50 according to a fourth embodiment will be herein below described with reference to FIG. 9. As shown, in the fourth embodiment, an impedance calculation process is different from that performed in the first embodiment again. That is, as shown in FIG. 9, in the impedance calculation process of the fourth embodiment, a noise signal is not removed but is avoided as described herein below.

Figure 9:
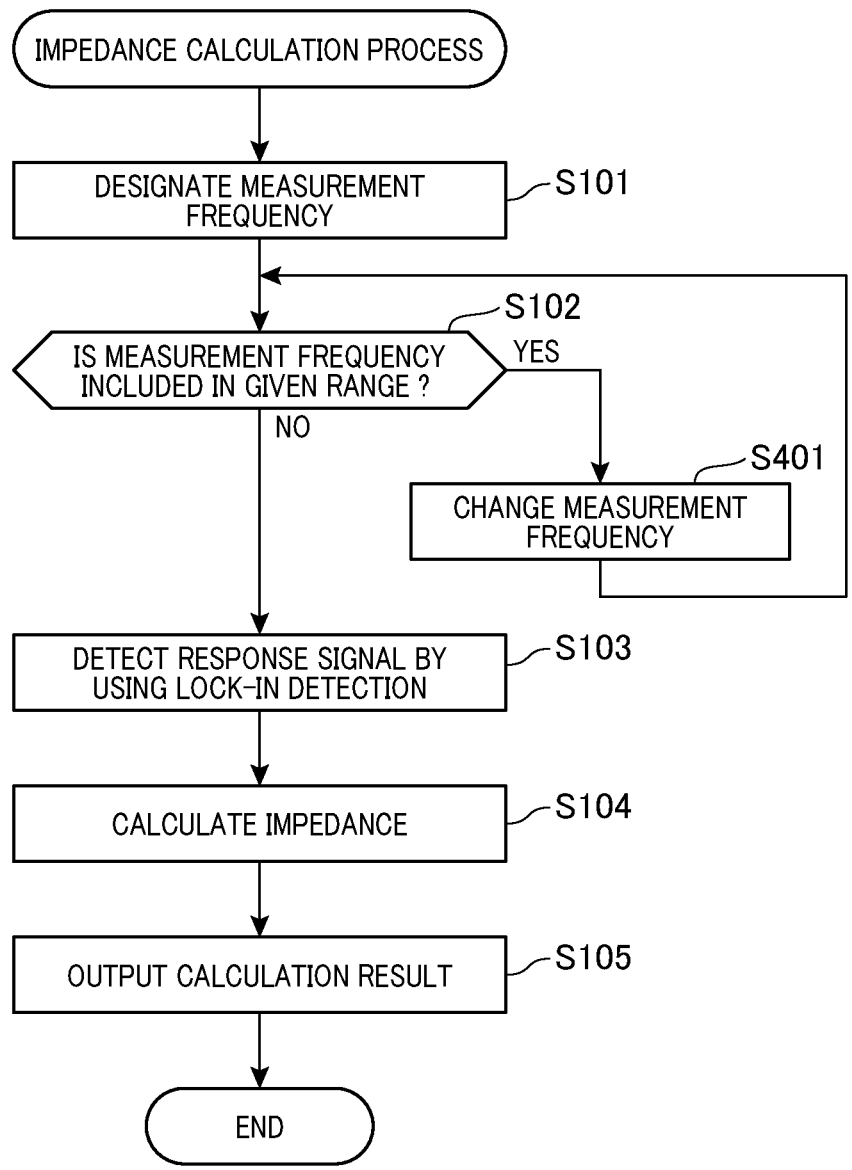
FIG. 9 is a flowchart illustrating an impedance calculation process according to a fourth embodiment of the present disclosure.

Specifically, the microcomputer 53 of the battery monitoring system 50 periodically executes an impedance calculation process shown in FIG. 9. In the impedance calculation process of FIG. 9, since processes from step S101 to step S105 are substantially the same as those in the first embodiment, description thereof are not repeated.

Hereinbelow, a process performed in the fourth embodiment when determination performed in step S102 is positive will be described. That is, a process performed when a measurement frequency is included in a given frequency range and accordingly, a noise signal having a given frequency is highly likely to occur will be described.

Specifically, if the determination performed in step S102 is positive, the microcomputer 53 changes the measurement frequency in step S401. To change the measurement frequency, an arbitrary method may be employed and it is only needed for a new measurement frequency to deviate from the frequency range. After completing a process of step S401, the process proceeds to a process of step S102. With this, the microcomputer 53 can readily avoid a noise signal.

Now, a battery monitoring system 50 according to a fifth embodiment will be herein below described with reference to FIG. 10. As shown, in the fifth embodiment, an impedance calculation process is different from that performed in the first embodiment. Specifically, as shown in FIG. 10, in the impedance calculation process of the fifth embodiment, a noise signal is not removed and is avoided as described herein below.

Figure 10:
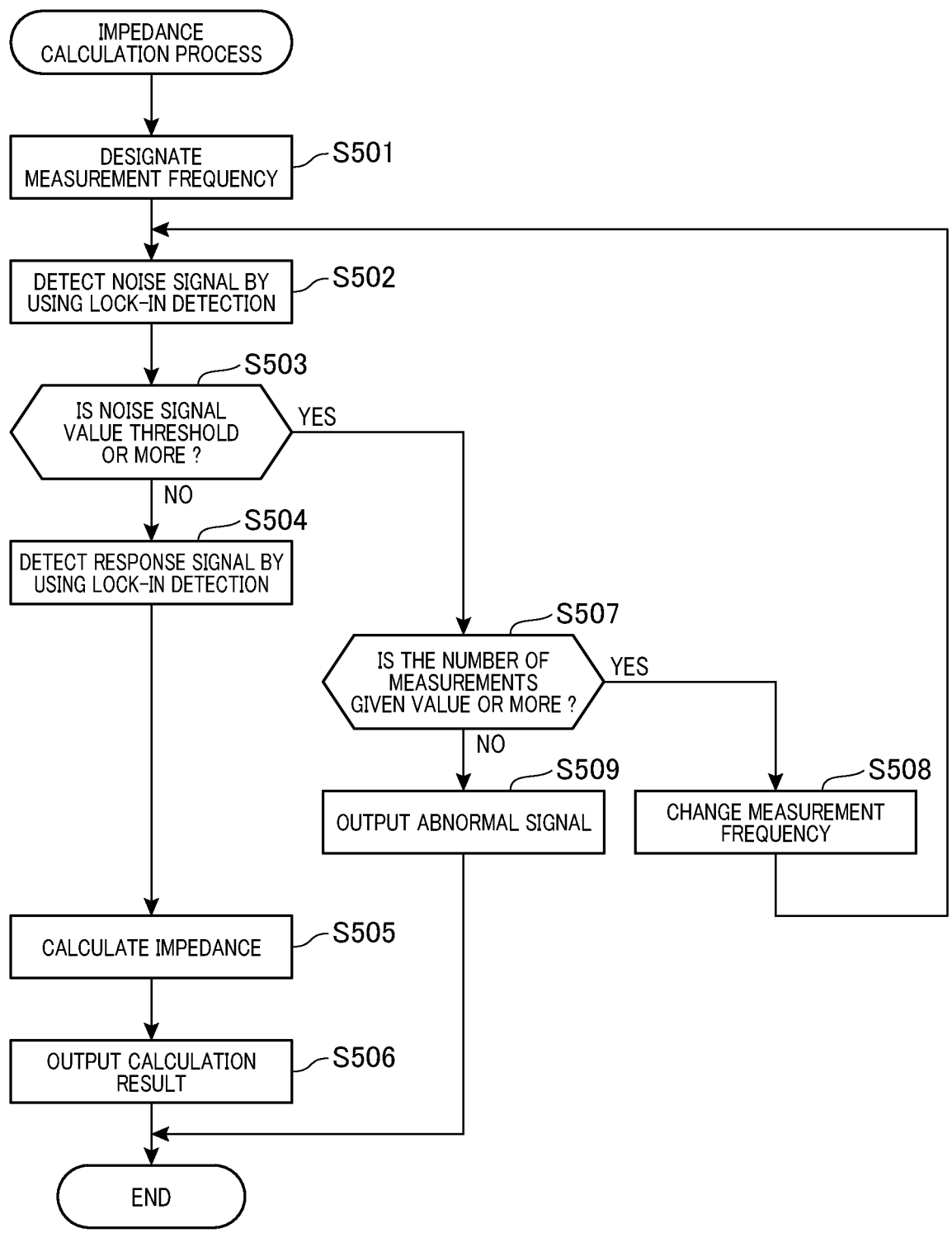
FIG. 10 is a flowchart illustrating an impedance calculation process according to a fifth embodiment of the present disclosure.

Specifically, the microcomputer 53 of the battery monitoring system 50 periodically executes an impedance calculation process shown in FIG. 10. As shown, in the impedance calculation process, the microcomputer 53 designates a measurement frequency for calculating a complex impedance in step S501) similar to the process of step S101. The measurement frequency is designated from among frequencies included in a given measurement range.

Subsequently, the microcomputer 53 instructs the lock-in amplifier 52 to detect a noise signal (i.e., background noise) in step S502) as performed in the process of step S106. Specifically, in step S502, the microcomputer 53 causes the lock-in amplifier 52 to perform lock-in detection of detecting a noise signal (i.e., background noise) detectable when disturbance is not applied to the battery cell 42. Here, since the lock-in detection of the noise signal performed by the lock-in amplifier 52 has been described earlier with reference to FIG. 5, the detailed description thereof is not repeated.

When the process of step S502 is completed and a frequency component of the noise signal is input thereto, the microcomputer 53 determines whether the frequency component of the noise signal as input is greater than a reference value in step S503. If the determination is negative, i.e., the noise signal is not greater, the microcomputer 53 notifies the lock-in amplifier 52 of a measurement frequency as performed in step S103 and instructs the lock-in amplifier 52 to detect a frequency component in a response signal corresponding to the measurement frequency in step S504. Here, since the lock-in detection of the response signal performed by the lock-in amplifier 52 has been described earlier with reference to FIG. 4, the same description is not repeated.

Subsequently, upon receiving the frequency component in the response signal, the microcomputer 53 calculates all or any of a real part, an imaginary part, an absolute value and a phase of a complex impedance based on the frequency component in the response signal as received and a current signal output from the battery cell 42 in step S505. Here, the current signal may be obtained based on either the feedback signal or the sine wave signal instructed by the instruction signal to be output.

Subsequently, the microcomputer 53 outputs the complex impedance as calculated to the ECU 60 via the communication unit 54 in step S506. Then, the impedance calculation process is terminated.

By contrast, if the determination performed in step S503 is positive, the microcomputer 53 determines whether the number of times when lock-in detection of the noise signal is performed is less than or equal to a given vale in step S507. Again, similar to the process performed in step S401 of the fourth embodiment, an arbitrary method of changing the measurement frequency may be employed. When the process of step S508 is completed, the process proceeds to step S502. Again, similar to the process performed in step S401 of the fourth embodiment, an arbitrary method of changing the measurement frequency may be employed. When the process of step S508 is completed, the process proceeds to step S502.

Further, if the determination in step S507 is negative by contrast, the microcomputer 53 outputs an abnormal signal to the ECU 60 via the communication unit 54 to inform that the microcomputer 53 cannot accurately receive the response signal in step S509. Then, the impedance calculation process is terminated.

Hence, by executing the impedance calculation process as shown in the fifth embodiment, the microcomputer 53 can readily avoid the noise signal, effectively.

Now, a battery monitoring system 50 according to a sixth embodiment will be herein below described with reference to FIG. 11. Specifically, the battery monitoring system 50 of the sixth embodiment performs so-called two-phase lock-in detection as will be herein below described in detail.

Figure 11:
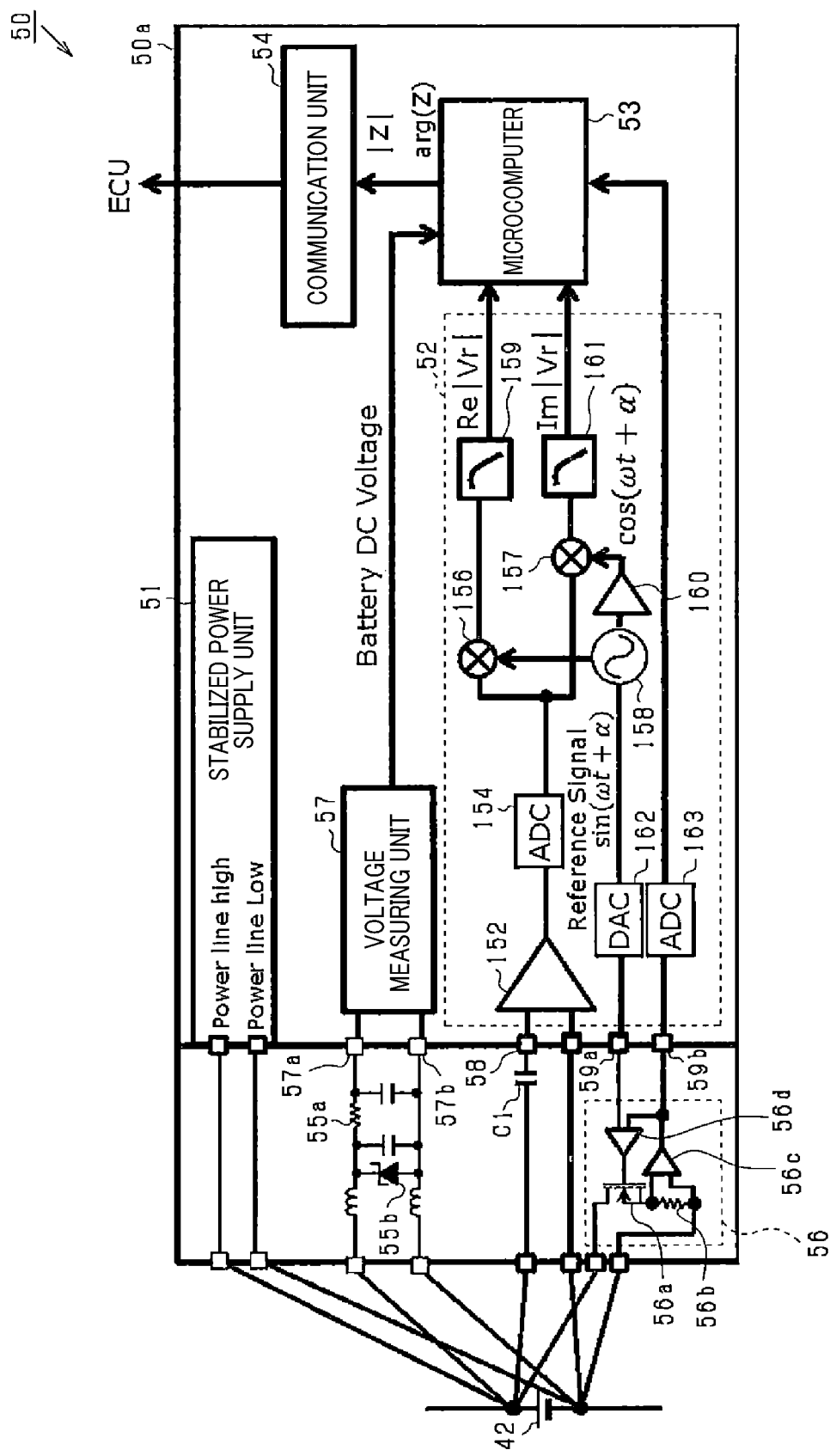
FIG. 11 is a diagram illustrating a configuration of a battery monitoring system according to a sixth embodiment of the present disclosure.

That is, as shown in FIG. 11, in a lock-in amplifier 52, a preamplifier 152 is provided as an amplifier to receive a voltage variation of the battery cell 42 through a set of response signal input terminals 58 when the sine wave signal is output. The preamplifier 152 amplifies the voltage variation input through the response signal input terminal 58 and outputs such an amplification result as a response signal. That is, since an amplitude of the response signal is relatively weak when compared to a voltage of the battery cell 42, the preamplifier 152 is provided to enhance and improve detection accuracy of the response signal. Here, although one stage of the preamplifier 152 is provided in the sixth embodiment, multi-stages thereof can be employed.

Further, as shown in FIG. 11, a capacitor C1 is provided between the positive electrode terminal of the battery cell 42 and the response signal input terminal 58 located closer to a positive electrode (i.e., positive electrode terminal) of the preamplifier 152 to remove the DC component. With this, a DC component (i.e., portion unrelated to the internal complex impedance information) can be removed from among the voltage variation of the battery cell 42, detection accuracy of the response signal can be improved.

Further, an AD converter 154 is provided in the lock-in amplifier 52 to convert a response signal (i.e., analog signal) output from the preamplifier 152 into a digital signal and outputs such a conversion result therefrom.

The AD converter 154 is also connected to each of a first multiplier 156 and a second multiplier 157 to input the response signal thereinto.

Further, an oscillation circuit 158 described later in detail is connected to the first multiplier 156 to input a first reference signal thereinto. The first multiplier 156 multiplies a response signal by a first reference signal, thereby calculating a value proportional to a real part of the response signal corresponding to a measurement frequency. The first multiplier 156 then outputs the value proportional to the response signal to the microcomputer 53 via a low-pass filter 159. In FIG. 11, the real part of the response signal is represented as Re|Vr|.

Further, the oscillation circuit 158 is also connected to the second multiplier 157 via a phase shift circuit 160 to input a second reference signal thereto. A phase of the second reference signal is advanced by an angle of 90 degrees (i.e., $\pi/2$) from that of the first reference signal. That is, the phase shift circuit 160 advances a phase of a sine wave signal (i.e., first reference signal) received from the oscillation circuit 158 as an input thereto and outputs such an advanced signal as the second reference signal.

The second multiplier 157 also multiplies the second reference signal by the response signal, thereby calculating a value proportional to an imaginary part of the response signal. The second multiplier 157 then outputs the value proportional to the imaginary part of the response signal to the microcomputer 53 via a low-pass filter 161. In FIG. 11, the imaginary part of the response signal is represented by Im|Vr|. Hence, the real part and the imaginary part of the response signal collectively correspond to the frequency component of the response signal corresponding to the measurement frequency.

Further, the oscillation circuit 158 outputs a sine wave signal determined in accordance with the measurement frequency. As described earlier, the oscillation circuit 158 outputs a sine wave signal as the first reference signal to the first multiplier 156 and the phase shift circuit 160, respectively. Further, the oscillation circuit 158 is also connected to the instruction signal output terminal 59a via the DA converter 162 to output the sine wave signal thereto as the instruction signal.

Further, the feedback signal input terminal 59b is connected to the microcomputer 53 via an AD converter 163. Hence, the microcomputer 53 receives a feedback signal (i.e., detection signal) from the feedback signal input terminal 59b.

Hence, the microcomputer 53 receives inputs of values proportional to the real part and the imaginary part of the response signal, thereby calculating the real part and the imaginary part of the complex impedance based on these values. At the same time, the microcomputer 53 calculates (i.e., corrects) the real part and the imaginary part of the complex impedance based on the feedback signal as received in consideration of an amplitude of a signal actually flowing and a deviation of a phase from that of the reference signal.

Further, the microcomputer 53 also calculates an absolute value and a phase of the complex impedance. Specifically, since the real part and the imaginary part of the response signal can be known by performing the two-phase lock-in detection, (a voltage of the response signal) can be represented on a polar coordinate display by a formula $|Vr|\angle j\theta v$, wherein $\theta v$ represents a phase of the response signal. Similarly, a current thereof can be represented by a formula $|I|\angle j\theta i$. Hence, since an equation V=ZI is well-known, the below described first equation can be established when the polar coordinate display of the complex impedance is represented by a formula $|Z|\angle j\theta z$, wherein j represents an imaginary unit that satisfies an equation $j^{\wedge}2=-1$.

$$|Z|e^{\wedge}j\theta z = |Vr|e^{\wedge}j\theta v/|I|e^{\wedge}j\theta i$$

Hence, an absolute value of the complex impedance is obtained by calculating the equation $|Z|=|Vr|/|I|$. Also, the phase can be obtained by calculating a formula $\theta v-\theta i$. Then, the microcomputer 53 outputs such calculation results to the ECU 60 via the communication unit 54. As shown in FIG. 11, the absolute value of the complex impedance is indicated by $|Z|$. A phase of the complex impedance is indicated by arg (Z).

Figure 12:
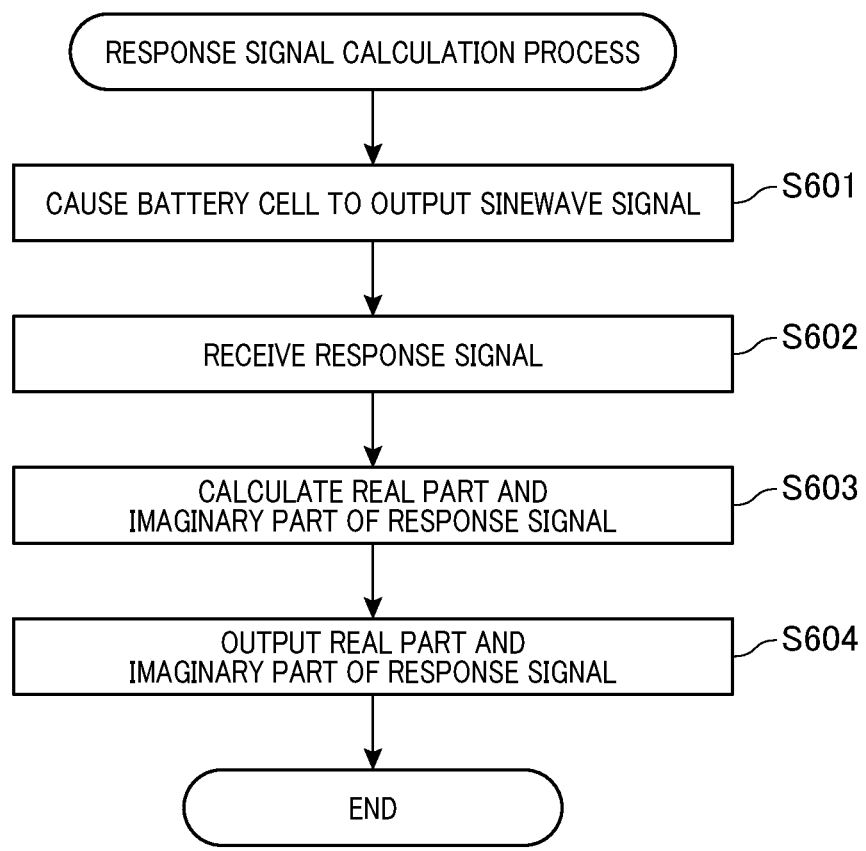
FIG. 12 is a flowchart illustrating a response signal detection process according to the sixth embodiment of the present disclosure.

Now, lock-in detection performed in the sixth embodiment will be herein below described with reference to FIG. 12. First, an exemplary process performed when the microcomputer 53 notifies the lock-in amplifier 52 of a measurement frequency in step S103 or the like to cause the lock-in amplifier 52 to acquire a frequency component corresponding to the measurement frequency from a response signal will be described with reference to FIG. 12.

Specifically, the oscillation circuit 158 of the lock-in amplifier 52 determines a frequency of a sine wave signal (i.e., given AC signal) based on the measurement frequency instructed by the microcomputer 53. Subsequently, the oscillation circuit 158 outputs an instruction signal from the instruction signal output terminal 59a to the current modulation circuit 56 via the DA converter 162 to direct the current modulation circuit 56 to output the sine wave signal in step S601. When such a digital signal is converted into an analog signal by the DA converter 162, an appropriate offset value (i.e., DC bias) is added to the digital signal and are collectively converted. Specifically, the offset value may be determined by the microcomputer 53, desirably based on a DC voltage of the battery cell 42. Such a DC voltage of the battery cell 42 may be measured by the voltage measuring unit 57.

With this, based on the power supplied by the battery cell 42, the current modulation circuit 56 causes the battery cell 42 to output a sine wave signal based on the instruction signal.

Further, when the sine wave signal is output from the battery cell 42, a voltage variation reflecting an internal complex impedance of the battery cell 42 occurs between positive and negative electrode terminals of the battery cell 42. Then, the preamplifier 152 in the lock-in amplifier 52 receives the voltage variation via the response signal input terminal 58 and outputs the input as a response signal in step S602).

Here, when it is input to the response signal input terminal 58, a DC component of the voltage variation is removed by the capacitor C1, so that only a characteristic portion of the voltage variation is extracted. Further, the preamplifier 152 amplifies the voltage variation weakened as a result of removal of the DC component and outputs such an amplification result as the response signal. At that time, the AD converter 154 converts the response signal input via a signal switching unit (not shown) into a digital signal and outputs such a conversion result. Here, a size of the DC component removed by the capacitor C1 is desirably determined in accordance with the DC voltage of the battery cell 42. Similarly, an amount of voltage variation to be amplified is desirably determined in accordance with the DC voltage of the battery cell 42.

Further, the first multiplier 156 multiplies the response signal input thereto from the AD converter 154 by a sine wave signal (i.e., first reference signal) input thereto from the oscillation circuit 158, thereby calculating a value proportional to a real part of the response signal in step S603. Similarly, the second multiplier 157 multiplies the response signal by a second reference signal input thereto from the phase shift circuit 160, thereby calculating a value proportional to the imaginary part of the response signal.

Subsequently, the lock-in amplifier 52 outputs these proportional values to the microcomputer 53 via a low-pass filter 159 and a low-pass filter 161, respectively, in step S604. Here, when the proportional values pass through the low-pass filter 159 and the low-pass filter 161, respectively, a signal other than the DC component is either attenuated or removed.

Further, when locking-in detection is performed to detect a noise signal, the process of step S601 is omitted. That is, the lock-in detection to detect a noise signal is performed without outputting an instruction signal for instructing the current modulation circuit 56 to output the sine wave signal.

Hence, according to the battery monitoring system 50 of the sixth embodiment, the below described various advantages can be obtained.

First, the lock-in amplifier 52 detects the value proportional to the real part of the response signal based on the value obtained by multiplying the response signal as input by the first reference signal. In addition, the lock-in amplifier 52 detects the value proportional to the imaginary part of the response signal based on the value obtained by multiplying the response signal by the second reference signal composed of the sine wave signal with its phase shifted. Subsequently, the microcomputer 53 calculates the complex impedance based on these values. Hence, by performing the so-called two-phase lock-in detection in this way, only the same frequency component as the measurement frequency can be extracted from the response signal. Accordingly, white noise and pink noise can be readily handled, thereby enabling highly accurate calculation of the complex impedance. Further, by performing the two-phase lock-in detection, phase adjustment between the reference signal and the response signal can be omitted.

Herein below, various modifications of the above-described embodiments of the present disclosure are described. First, although it is provided for each of the battery cells 42 in the above-described embodiment, the battery monitoring system 50 may be provided for each of units of battery cells 42 (e.g., battery modules 41, assembled battery 40). In such a situation, a function of the battery monitoring system 50 can be shared with each other.

Figure 13:
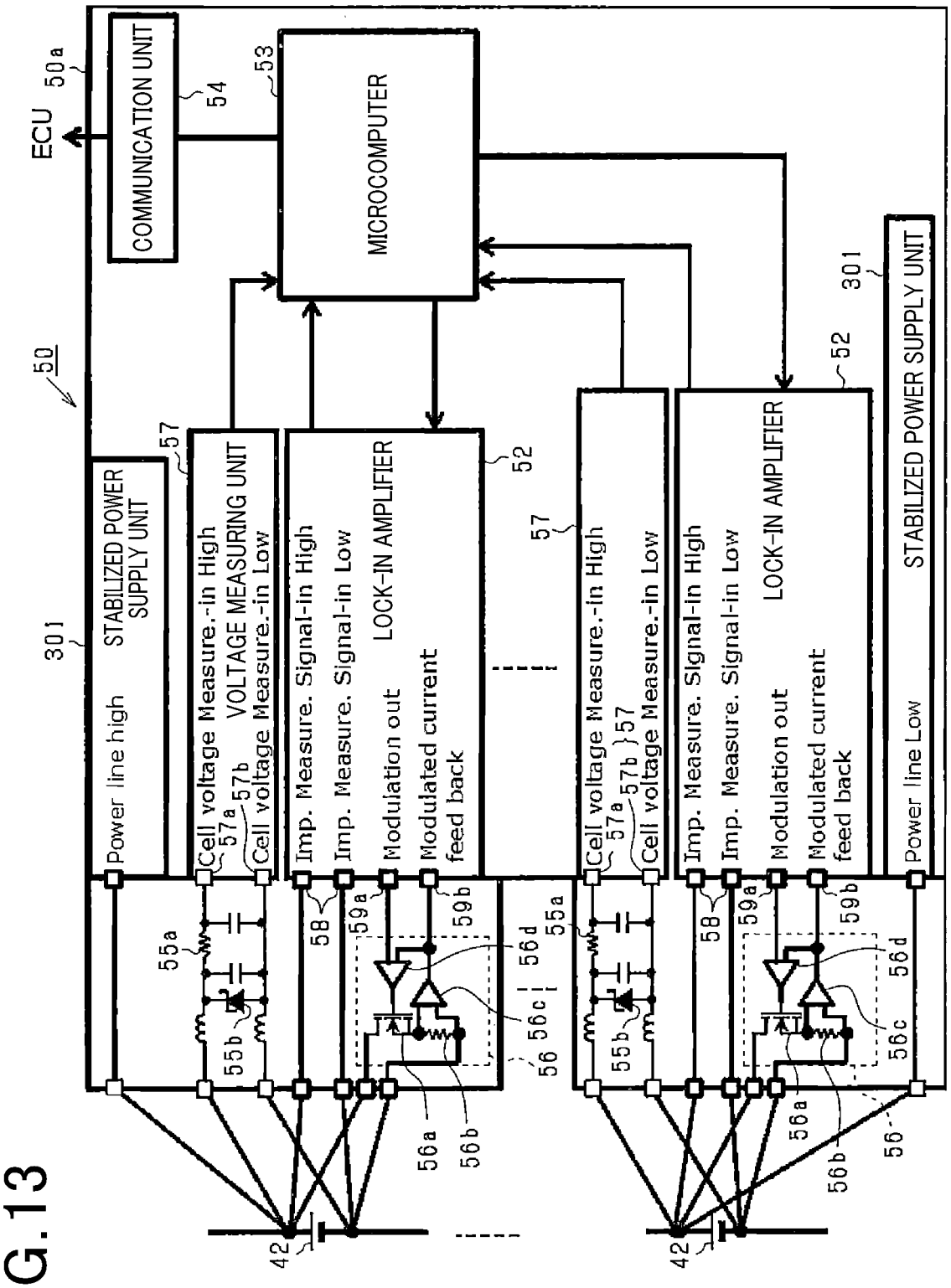
FIG. 13 is a diagram illustrating a configuration of a battery monitoring system according to yet another embodiment of the present disclosure.

For example, as shown in FIG. 13, the stabilized power supply unit 301, the communication unit 54 and the microcomputer 53 can be shared. In such a situation, a potential of the negative electrode may be sometimes different per battery cell 42. Hence, a reference potential of each of electrical signals utilized when information of each of the battery cells 42 is transmitted is sometimes different from the other. In view of this, a function of inputting each of electrical signals to the microcomputer 53 in accordance with a difference in reference potential is need to perform calculation. As a signal transmission device to communicate a signal between different reference potentials, a capacitor, a transformer, a radio wave and light can be exemplified.

Secondly, in the above-described embodiment, the battery monitoring system 50 can perform an equalization process of equalizing the power storage state and the voltage of each of the battery cells 42. The equalization process includes a process of discharging a battery cell 42 in a higher power storage state than the other battery cells 42 to equalize the power storage state thereof with that of the other battery cells 42. With this, since the power storage state of each of the battery cells 42 is aligned with each other, partial overcharge of the battery cell 42 can be either suppressed or reduced. Further, when it performs the equalization process, the battery monitoring system 50 may cause the battery cell 42 to discharge by using the current modulation circuit 56. In such a situation, the battery monitoring system 50 functions as a discharge controller.

More specifically, in the above-described modification, when it receives a discharge instruction from ECU 60 or the like in accordance with a power storage state of each of battery cells 42 or one of a power storage state and a voltage of a battery cell 42 becomes more than a given value, the microcomputer 53 outputs an instruction signal to the current modulation circuit 56 to cause the battery cell 42 to output a sine wave signal, a periodic function such as a rectangular wave, etc., or a DC signal. Subsequently, the microcomputer 53 continuously outputs the instruction signal until either the input of the discharge instruction becomes absent or either the power storage state or the voltage of the battery cell 42 becomes smaller than the given value. With this, the equalization process is completed.

Further, when causing the battery cell 42 to discharge for the purpose of the equalization process, a complex impedance can be calculated by causing the battery cell 42 to output the sine wave signal. With this, power consumption can be either suppressed or reduced. Here, the current to be output for the purpose of equalization is generally weak in order to either suppress or reduce power consumption and minimizing the system. Hence, the equalization process is particularly advantageously employed in the battery monitoring system 50 even if the weak current is used as in the above-described modification, because the complex impedance is accurately calculated therein based on the lock-in detection.

Further, in the above-described embodiment, the filter unit 55 may not be necessarily composed only of elements. For example, a wiring system, a connector contact portion, a pattern wiring system and a solid pattern as formed on a printed circuit board can be included to constitute the filter unit 55. Further, a mixture of these devices and the element can be also employed.

Further, in the above-described embodiment, a filter circuit may be provided between the current modulation circuit 56 and the lock-in amplifier 52. With this, an error generally caused when the instruction signal is converted into an analog signal can be either suppressed or reduced.

Further, in the above-described embodiment, the feedback circuit 56d can be omitted. Further, the current flowing through the resistor 56b is not necessarily detected by the current detection amplifier 56c. Further, the microcomputer 53 may not receive the feedback signal.

Further, although the voltage measuring unit 57 is provided in the above-described embodiment to detect the DC voltage, the DC voltage may not be necessarily detected.

Furthermore, the battery monitoring system 50 of the above-described embodiment may be employed in various transportation systems, such as a HEV (Hybrid Electric Transportation system), an EV (Electric Transportation system), a PHV (Plug-in Hybrid Transportation system), etc. The battery monitoring system 50 of the above-described embodiment may also be employed in an auxiliary battery, an electric airplane and an electric motorcycle. The battery monitoring system 50 of the above-described embodiment may also be employed in an electric ship.

Further, in the above-described embodiment, the battery cells 42 can be connected parallel to each other.

Furthermore, in the above-described embodiment, a state of a battery may be monitored per battery module 41. In such a situation, specifically, when the communication unit 54 is provided for each of the battery modules 41, a communication from each of communication units 54 to the ECU 60 sometimes becomes so called insulation communication necessitating a different potential criterion, such as when an insulating transformer or a capacitor is employed.

Furthermore, in the above-described embodiment, the feedback signal may be detected by using lock-in detection including two-phase lock-in detection. With this, by measuring the feedback signal by using the lock-in detection, an amplitude and a phase of the current signal actually output from the battery cell 42 can be accurately measured even when noise is included. Further, if the feedback signal is utilized in calculating the complex impedance, calculation accuracy thereof can be effectively improved.

Here, when a measurement frequency component of a current signal, such as a feedback signal, etc., is obtained by applying the lock-in detection thereto and is used in calculating the complex impedance, the same processing as performed in FIG. 3 is also needed during the lock-in detection detecting the current signal to remove a noise component. As a timing of performing the lock-in detection for the current signal can be before or after measurement of the response signal, or before and after the measurement of the response signal, for example. In such a situation, when the detection of the current signal is performed before and after the measurement of the response signal and a difference in noise component obtained before and after the measurement of the response signal is greater than a given reference value, the measurement process is performed again. Further, when the difference in noise component obtained before and after the measurement does not decrease less than a given reference value despite of repetitious measurement by the specified number of times, an abnormal signal is output to the ECU 60 and the impedance calculation process is terminated.

Furthermore, in the above-described embodiment, the current signal to be output from the battery cell 42 is not limited to the sine wave signal and may be a signal, such as a rectangular wave, a triangular wave, etc., as long as it belongs to an AC signal.

Further, in the above-described embodiment, the ECU 60 may be composed of multiple ECU elements. For example, multiple ECU elements may be provided per function. Otherwise, multiple ECU elements may be provided per control target. For example, the multiple ECU elements may be divided into a battery dedicated ECU element and an inverter dedicated ECU element.

Furthermore, in the above-described embodiment, the battery cell 42 (i.e., battery module 41 or assembled battery 40) may be used as a power source for a peripheral circuit when it outputs the sine wave signal (i.e., response signal) based on the instruction. By contrast, the battery cell 42 (i.e., battery module 41 or assembled battery 40) can be configured not to be available as a power source to the peripheral circuit when it outputs the sine wave signal (i.e., response signal) based on the instruction.

Further, the method of changing the measurement frequency performed in each of processes of Step S401 of the fourth embodiment and step S508 of the fifth embodiment can be performed as described hereinbelow. That is, with reference to a previously acquired complex impedance plane plot (i.e., call-call plot), a closest frequency to the current measurement frequency is identified from among frequencies expected to cause a smaller amount of change in complex impedance than a given value, and is used as the measurement frequency. In such a situation, whether or not the amount of change is relatively small can be identified by an amount of differentiation. Otherwise, a battery state (e.g., temperature of the battery cell 42, SOC) acquired last time may be compared with a current battery state thereby predicting a current complex impedance plane plot, and the frequency can be predicted based on the complex impedance plane plot.

Further, in the above-described embodiment, as the noise source, not only a noise source such as an inverter 30, etc., mounted on the transportation system, but also a noise source, such as a rapid charger, etc., temporarily connected to the transportation system can also be included.

Furthermore, in the above-described embodiment, the measurement range (see step S101, etc.) designated to calculate the complex impedance may be determined based on a frequency of a noise signal output from either the noise source mounted on the transportation system (e.g., inverter 30) or the noise source temporarily connected to the transportation system (e.g., the rapid charger). Specifically, a range capable of avoiding the frequency of the noise signal can be employed. For example, as a method of designating the measurement range, a map of frequencies at which noise generation is predicted is obtained in advance and a frequency other than that on the map may be designated. With this, neither noise determination nor noise removal is needed.

Furthermore, as another example, one or more fixed frequencies are determined in advance and a given measurement frequency is selectively designated from among the fixed frequencies. Here, the fixed frequencies may be determined from frequencies included in the above-described measurement range, for example. Otherwise, a map of frequencies at which noise generation is predicted can be obtained in advance and the fixed frequency is determined to avoid the frequencies on the map. Yet otherwise, both of the selection of the fixed frequency and the designation of the frequency from the measurement range may be employed at the same time.

Numerous additional modifications and variations of the present disclosure are possible in light of the above teachings. It is hence to be understood that within the scope of the appended claims, the present disclosure may be executed otherwise than as specifically described herein. For example, the present disclosure is not limited to the above-described battery monitoring system and may be altered as appropriate. Further, the present disclosure is not limited to the above-described battery monitoring method and may be altered as appropriate. Furthermore, the present disclosure is not limited to the above-described transportation system with a battery monitoring system and may be altered as appropriate.

What is claimed is:

1. A battery monitoring system for monitoring a state of a storage battery composed of an electrolyte and multiple electrodes, the battery monitoring system being implemented in a transportation system and comprising:
   a signal controller configured to cause the storage battery to output an AC signal as a response signal, the storage battery outputting the AC signal based on its own power;
   a lock-in amplifier configured to receive the response signal from the storage battery; and
   a processor configured to:
      designate a waveform of the AC signal to be output by the storage battery, the waveform defining a reference frequency used in measuring a complex impedance of the storage battery;
      determine whether the reference frequency is within a predetermined range of noise signal frequencies;
      when the reference frequency is not within the predetermined range of noise signal frequencies,
         cause the storage battery to output the AC signal as the response signal,
         cause the lock-in amplifier to perform a lock-in detection to detect a frequency component included in the response signal at the reference frequency, and
         calculate a complex impedance of the storage battery based on the detected frequency component in the response signal,
      when the reference frequency is within the predetermined range of noise signal frequencies,
         before the signal controller causes the storage battery to output the AC signal as the response signal, cause the lock-in amplifier to perform a lock-in detection to detect a frequency component included in a first signal at the reference frequency, and
         determine whether the first signal is a noise signal based on a determination of whether the frequency component of the first signal satisfies a first threshold value, and
      when the frequency component of the first signal satisfies the first threshold value, the first signal is a noise signal occurring a first time, and the processor is further configured to:
         after the signal controller causes the storage battery to output the AC signal as the response signal, cause the lock-in amplifier to perform a lock-in detection to detect a frequency component of the response signal including the noise signal;
         cause the lock-in amplifier to perform a lock-in detection to detect a frequency component included in a second signal, the second signal being a noise signal at a second time, which is after the first time;
         compare the frequency component of the first signal with the frequency component of the second signal;
         when a difference between the frequency component of the first signal and the frequency component of the second signal satisfies a second threshold value, either avoid or remove the noise signal; and calculate the complex impedance of the storage battery based on the frequency component detected in the response signal upon removal or avoidance of the noise signal.

2. The battery monitoring system according to claim 1, wherein when the frequency component of the first signal does not satisfy the first threshold value, the first signal is not a noise signal, and the processor is further configured to:
cause the lock-in amplifier to perform the lock-in detection to detect the frequency component included in the response signal at the reference frequency, and
calculate the complex impedance of the storage battery based on the detected frequency component in the response signal.

3. The battery monitoring system according to claim 1, wherein before the signal controller causes the storage battery to output the AC signal as the response signal, the lock-in amplifier is configured to perform the lock-in detection to detect the frequency component included in the first signal at the reference frequency based on a product of the first signal and the reference frequency.

4. The battery monitoring system according to claim 1, wherein the processor is configured to recognize a presence of the noise signal when the reference frequency of the AC signal is within a given noise range.

5. The battery monitoring system according to claim 1, wherein the processor is configured to instruct the signal controller to cause the storage battery to output the AC signal as the response signal by changing a frequency of the AC signal.

6. A transportation system comprising:
a noise generation source mounted on the transportation system; and
a battery monitoring system for monitoring a state of a storage battery including an electrolyte and multiple electrodes, the battery monitoring system comprising:
a signal controller configured to cause the storage battery to output an AC signal as a response signal, the storage battery outputting the AC signal based on its own power;
a lock-in amplifier configured to receive the response signal from the storage battery; and
a processor configured to:
designate a waveform of the AC signal to be output by the storage battery, the waveform defining a reference frequency used in measuring a complex impedance of the storage battery;
determine whether the reference frequency is within a predetermined range of noise signal frequencies;
when the reference frequency is not within the predetermined range of noise signal frequencies,
cause the storage battery to output the AC signal as the response signal,
cause the lock-in amplifier to perform a lock-in detection to detect a frequency component included in the response signal at the reference frequency, and
calculate a complex impedance of the storage battery based on the detected frequency component included in the response signal,
when the reference frequency is within the predetermined range of noise signal frequencies,
before the signal controller causes the storage battery to output the AC signal as the response signal, cause the lock-in amplifier to perform a lock-in detection to detect a frequency component included in a first signal at the reference frequency, and
determine whether the first signal is a noise signal based on a determination of whether the frequency component of the first signal satisfies a first threshold value, and
when the frequency component of the first signal satisfies the first threshold value, the first signal is a noise signal occurring at a first time, and the processor is further configured to:
after the signal controller causes the storage battery to output the AC signal as the response signal, cause the lock-in amplifier to perform a lock-in detection to detect a frequency component of the response signal including the noise signal;
cause the lock-in amplifier to perform a lock-in detection to detect a frequency component included in a second signal, the second signal being a noise signal occurring at a second time, which is after the first time;
compare the frequency component of the first signal with the frequency component of the second signal;
when a difference between the frequency component of the first signal and the frequency component of the second signal satisfies a second threshold value, either avoid or remove the noise signal; and
calculate the complex impedance of the storage battery based on the frequency component detected in the response signal upon removal or avoidance of the noise signal.

7. A method of monitoring a state of a storage battery composed of an electrolyte and multiple electrodes mounted on a transportation system, the method comprising:
causing the storage battery to output an AC signal as a response signal, the storage battery outputting the AC signal based on its own power;
receiving the response signal from the storage battery; and
designating a waveform of the AC signal to be output by the storage battery, the waveform defining a reference frequency used in measuring a complex impedance of the storage battery;
determining whether the reference frequency is within a predetermined range of noise signal frequencies;
when the reference frequency is not within the predetermined range of noise signal frequencies,
causing the storage battery to output the AC signal as the response signal,
performing a lock-in detection to detect a frequency component included in the response signal at the reference frequency, and
calculating a complex impedance of the storage battery based on the detected frequency component included in the response signal,
when the reference frequency is within the predetermined range of noise signal frequencies,
before causing the storage battery to output the AC signal as the response signal, performing a lock-in detection to detect a frequency component included in a first signal at the reference frequency, and
determining whether the first signal is a noise signal based on a determination of whether the frequency component of the first signal satisfies a first threshold value, and when the frequency component of the first signal satisfies the first threshold value, the first signal is a noise signal occurring at a first time, and the method further comprising:
- after causing the storage battery to output the AC signal as the response signal, performing a lock-in detection to detect a frequency component of the response signal including the noise signal;
- performing a fourth lock-in detection to detect a frequency component included in a second signal, the second signal being a noise signal occurring at a second time, which is after the first time;
- comparing the frequency component of the first signal with the frequency component of the second signal;
- when a difference between the frequency component of the first signal and the frequency component of the second signal satisfies a second threshold value, either avoiding or removing the noise signal; and
- calculating the complex impedance of the storage battery based on the frequency component detected in the response signal upon removal or avoidance of the noise signal.

* * * * *